United States Patent
Park et al.

(10) Patent No.: US 10,347,819 B2
(45) Date of Patent: Jul. 9, 2019

(54) MAGNETIC MEMORY DEVICES HAVING CONDUCTIVE PILLAR STRUCTURES INCLUDING PATTERNING RESIDUE COMPONENTS

(71) Applicant: Samsung Electronics Co., Ltd., Suwon-si, Gyeonggi-do (KR)

(72) Inventors: Jongchul Park, Seongnam-si (KR); Byoungjae Bae, Hwaseong-si (KR); Inho Kim, Suwon-si (KR); Shin Kwon, Yongin-si (KR); Eunsun Noh, Suwon-si (KR); Insun Park, Seoul (KR); Sangmin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 242 days.

(21) Appl. No.: 15/340,330

(22) Filed: Nov. 1, 2016

(65) Prior Publication Data

US 2017/0047509 A1 Feb. 16, 2017

Related U.S. Application Data

(62) Division of application No. 14/522,865, filed on Oct. 24, 2014, now Pat. No. 9,515,255.

(30) Foreign Application Priority Data

Jan. 6, 2014 (KR) .................. 10-2014-0001314

(51) Int. Cl.
H01L 27/22 (2006.01)
H01L 43/08 (2006.01)
(Continued)

(52) U.S. Cl.
CPC ............ H01L 43/02 (2013.01); G11C 11/161 (2013.01); H01L 21/0335 (2013.01);
(Continued)

(58) Field of Classification Search
CPC ............ H01L 21/0334; H01L 21/0337; H01L 21/3083; H01L 21/3085; H01L 43/08;
(Continued)

(56) References Cited

U.S. PATENT DOCUMENTS 6,930,866 B2  8/2005  Jayasekara
8,288,289 B2  10/2012  Jeong et al.
(Continued)

FOREIGN PATENT DOCUMENTS

JP  2003298150  10/2003
JP  2004-529509 A  9/2004
(Continued)

*Primary Examiner* — Jesse Y Miyoshi
(74) *Attorney, Agent, or Firm* — Sughrue Mion, PLLC

(57) ABSTRACT

Methods of manufacturing a semiconductor device include forming a conductive layer on a substrate, forming an air gap or other cavity between the conductive layer and the substrate, and patterning the conductive layer to expose the air gap. The methods may further include forming conductive pillars between the substrate and the conductive layer. The air gap may be positioned between the conductive pillars.

15 Claims, 27 Drawing Sheets

(51) Int. Cl.
*H01L 21/033* (2006.01)
*G11C 11/16* (2006.01)
*H01L 43/02* (2006.01)
*H01L 43/10* (2006.01)
*H01L 43/12* (2006.01)

(52) U.S. Cl.
CPC ............ *H01L 27/228* (2013.01); *H01L 43/08* (2013.01); *H01L 43/10* (2013.01); *H01L 43/12* (2013.01)

(58) Field of Classification Search
CPC ....... H01L 27/222–228; H01L 21/0335; G11C 11/161
See application file for complete search history.

(56) References Cited

U.S. PATENT DOCUMENTS

| | | | |
|---|---|---|---|
| 9,142,757 B2 * | 9/2015 | Park | .............. H01L 43/12 |
| 2002/0146887 A1 | 10/2002 | Liu | |
| 2002/0187610 A1 | 12/2002 | Furukawa et al. | |
| 2004/0206982 A1 | 10/2004 | Lee | |
| 2008/0265347 A1 | 10/2008 | Iwayama et al. | |
| 2009/0159562 A1 | 6/2009 | Cho et al. | |
| 2009/0173977 A1 | 7/2009 | Xiao et al. | |
| 2010/0184239 A1 | 7/2010 | Matsuzaki | |
| 2010/0311243 A1 | 12/2010 | Mao | |
| 2012/0315707 A1 * | 12/2012 | Nam | .............. H01L 43/12 438/3 |
| 2013/0032775 A1 | 2/2013 | Satoh et al. | |
| 2014/0225251 A1 | 8/2014 | Lee | |
| 2014/0269005 A1 * | 9/2014 | Kang | ............ H01L 45/1666 365/148 |
| 2014/0284743 A1 * | 9/2014 | Aikawa | ............. H01L 43/12 257/427 |

FOREIGN PATENT DOCUMENTS

| | | |
|---|---|---|
| JP | 2007234646 | 9/2007 |
| JP | 2008218829 | 9/2008 |
| JP | 2011-096780 A | 5/2011 |
| JP | 2011-159963 A | 8/2011 |
| JP | 2012-089587 A | 5/2012 |
| KR | 20090105698 | 10/2009 |

* cited by examiner

MAGNETIC MEMORY DEVICES HAVING CONDUCTIVE PILLAR STRUCTURES INCLUDING PATTERNING RESIDUE COMPONENTS

CROSS-REFERENCE TO RELATED APPLICATION

This application is a divisional of U.S. patent application Ser. No. 14/522,865, filed Oct. 24, 2014 and claims the benefit of Korean Patent Application No. 10-2014-0001314, filed on Jan. 6, 2014, in the Korean Intellectual Property Office, the disclosures of which are hereby incorporated by reference in their entireties.

BACKGROUND

The inventive concepts relate to semiconductor devices and methods of manufacturing the same and, more particularly, to methods of fabricating conductive patterns and semiconductor devices fabricated using the same.

Demand for high speed and low power semiconductor memory devices has increased with the development of high speed and low power electronic devices. Magnetic memory devices have been developed in order to satisfy the demand. Magnetic memory devices can support high-speed operation while being non-volatile, so they have become candidates for next-generation semiconductor memory devices. Other potential next-generation semiconductor memory devices, such as ferroelectric random access memory (FRAM) devices and phase change RAM (PRAM) devices, have also been developed. These next-generation semiconductor memory devices typically store information by using materials having resistance values that vary according to applied voltages or currents and retain their stored resistance values when their power supplies are interrupted. These resistance memory devices have also been highly integrated.

SUMMARY

Some embodiments of the inventive concepts may provide manufacturing methods capable of reduce or minimize re-deposition of residues of a patterning process of a conductive layer.

Some embodiments of the inventive concepts may also provide manufacturing methods capable of preventing a short that may be caused between conductive layers by re-deposition of a conductive residues.

According to some embodiments, methods of manufacturing a semiconductor device include forming a conductive layer on a substrate, forming an air gap between the conductive layer and the substrate, and patterning the conductive layer to expose the air gap. The methods may further include forming conductive pillars between the substrate and the conductive layer. The air gap may be positioned between the conductive pillars.

In some embodiments, the methods include forming a sacrificial layer surrounding the conductive pillars and forming the air gap by removing the sacrificial layer. A capping insulating layer may be formed between the conductive pillars before the formation of the sacrificial layer. The capping insulating layer may extend onto sidewalls of the conductive pillars.

In some embodiments, the methods include forming a mold insulating layer on the sacrificial layer, the mold insulating layer exposing top surfaces of the conductive pillars, and leaving the mold insulating layer after the sacrificial layer is removed. The mold insulating layer may be formed of a material having an etch selectivity with respect to the sacrificial layer.

In some embodiments, the methods include forming contacts connecting the conductive pillars to the substrate and forming conductive pads between the conductive pillars and the contacts.

In some embodiments, forming the conductive layer may include sequentially forming a first conductive layer, an insulating layer, and a second conductive layer. The first and second conductive layers may include ferromagnetic layers.

In some embodiments, forming the air gap may include forming conductive pillars between the substrate and the conductive layer, sequentially forming a sacrificial layer and a mold insulating layer between the conductive pillars and removing the sacrificial layer. Forming the mold insulating layer may include forming first mold patterns on sidewalls of upper portions of the conductive pillars, wherein at least a portion of the sacrificial layer is exposed by openings between the first mold patterns and wherein the sacrificial layer is removed through the openings between the first mold patterns. The first mold patterns may be formed by a spacer formation process.

In some embodiments, forming the mold insulating layer further includes forming second mold patterns filling the openings between the first mold patterns after the removal of the sacrificial layer. The methods may further include performing a planarization process to expose top surfaces of the conductive pillars after the formation of the second mold patterns.

In some embodiments, forming the first mold patterns may include forming a first mold layer on the sacrificial layer and forming a through-hole in the first mold layer to expose the sacrificial layer.

In some embodiments, some of the conductive pillars are spaced apart from each other at a first distance and others of the conductive pillars are spaced apart from each other at a second distance greater than the first distance.

In further embodiments, forming the air gap may include forming conductive pillars between the substrate and the conductive layer and forming a mold insulating layer having a poor step coverage such that a space between the conductive pillars is not filled.

Still further embodiments provide methods including forming contacts on a substrate, forming conductive pillars on the contacts, forming a sacrificial layer and a mold insulating layer between the conductive pillars, selectively removing the sacrificial layer to form an air gap between the mold insulating layer and the substrate, forming a magnetic tunnel junction layer on the mold insulating layer, and patterning the magnetic tunnel junction layer to expose the air gap.

Forming the mold insulating layer may include forming first mold patterns on sidewalls of upper portions of the conductive pillars. The sacrificial layer may be exposed between adjacent ones of the first mold patterns and the sacrificial layer may be removed through an opening between the adjacent ones of the first mold patterns.

The methods may further include forming second mold patterns filling the opening between the adjacent ones of the first mold patterns after the removal of the sacrificial layer.

In some embodiments, forming the first mold patterns may include forming a first mold layer on the sacrificial layer and forming a through-hole in the first mold layer to expose the sacrificial layer.

In some embodiments, some of the conductive pillars are spaced apart from each other at a first distance and others of the conductive pillars are spaced apart from each other at a second distance greater than the first distance.

In some embodiments, the sacrificial layer may be removed using an ashing process.

Further embodiments provide magnetic memory devices including a substrate, contacts disposed on the substrate, conductive pillars disposed on the contacts, magnetic tunnel junction structures disposed on the conductive pillars, and residual mold patterns provided under the magnetic tunnel junction structures, the residual mold patterns surrounding upper portions of the conductive pillars. The residual mold patterns may be ring shaped.

In some embodiments, sidewalls of the residual mold patterns are substantially coplanar with sidewalls of the magnetic tunnel junction structures disposed on the residual mold patterns. Bottom surfaces of the residual mold patterns may be higher than bottom surfaces of the conductive pillars.

In some embodiments, the memory devices may further include a protection insulating layer extending along sidewalls of the conductive pillars, sidewalls of the magnetic tunnel junction structures, and sidewalls of the residual mold patterns. The residual mold patterns may include a material different from that of the protection insulating layer.

In some embodiments, the memory devices may further include a capping insulating layer provided along a sidewall and a bottom surface of a gap region between the conductive pillars. The capping insulating layer may be in contact with bottom surfaces of the magnetic tunnel junction structures.

In some embodiments, the memory devices may further include a conductive etch residue layer disposed between the capping insulating layer and the protection insulating layer.

In some embodiments, the memory devices may further include conductive pads disposed between the contacts and the conductive pillars.

Further embodiments provide methods including forming at least one conductive pillar on a substrate, forming a mold structure surrounding the at least one conductive pillar and defining a cavity between the mold structure and the substrate, forming at least one conductive material layer on the mold structure, and patterning the at least one conductive material layer to form at least one conductive pattern on the at least one conductive pillar, wherein the patterning removes portions of the mold structure to expose the cavity and allow conductive residue from the patterning to be deposited in the cavity.

In some embodiments, forming the mold structure may include forming a sacrificial layer on the substrate, forming first mold patterns on the sacrificial layer, removing the sacrificial layer through at least one opening between the first mold patterns, and forming second mold patterns in the at least one opening to enclose the cavity. The first mold patterns may include at least one ring-shaped sidewall spacer pattern surrounding the at least one conductive pillar.

In some embodiments, forming the mold structure may include depositing a material on the substrate and the at least one conductive pillar, wherein the material has a step coverage that provides for formation of the cavity. The deposited material may be planarized to expose the at least one conductive pillar.

In some embodiments, forming the mold structure may include forming a sacrificial layer on the substrate and having an upper surface lower than an upper surface of the at least one conductive pillar, forming a first molding layer on the sacrificial layer, forming at least one opening through the first molding layer to expose the sacrificial layer, removing the sacrificial layer through the at least one opening, and forming a second molding layer in the at least one opening.

In some embodiments, forming the molding structure may include forming a sacrificial layer on the substrate, forming first molding patterns on the sacrificial layer, removing at least one of the at least one conductive pillars to form an opening between at least two of the first molding patterns that exposes the sacrificial pattern, removing the exposed sacrificial pattern, and forming at least one second molding pattern in the opening.

In some embodiments, forming the at least one conductive material layer on the mold structure may include forming a magnetic memory layer structure comprising the at least one conductive material layer. Patterning the at least one conductive material layer to form a conductive pattern on the at least one conductive pillar may include forming a magnetic memory cell on the at least one conductive pillar.

BRIEF DESCRIPTION OF THE DRAWINGS

The inventive concepts will become more apparent in view of the attached drawings and accompanying detailed description.

DETAILED DESCRIPTION

Figure 1:
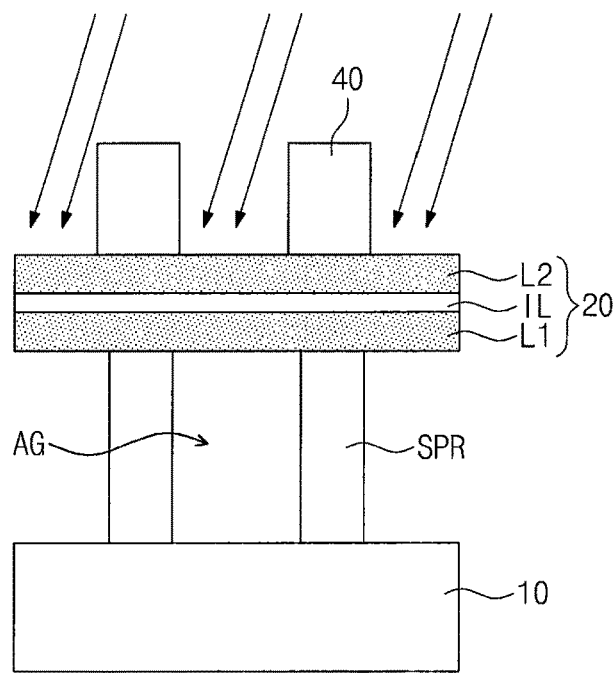
FIGS. 1 to 3 are cross-sectional views illustrating operations for manufacturing a semiconductor device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
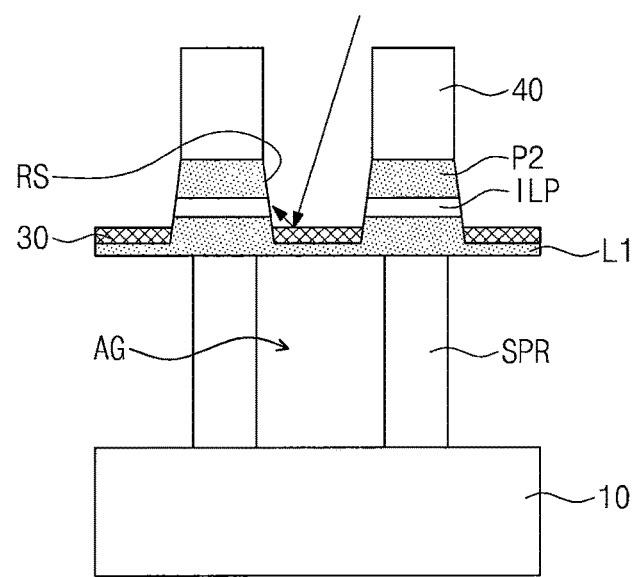
Figure 3:
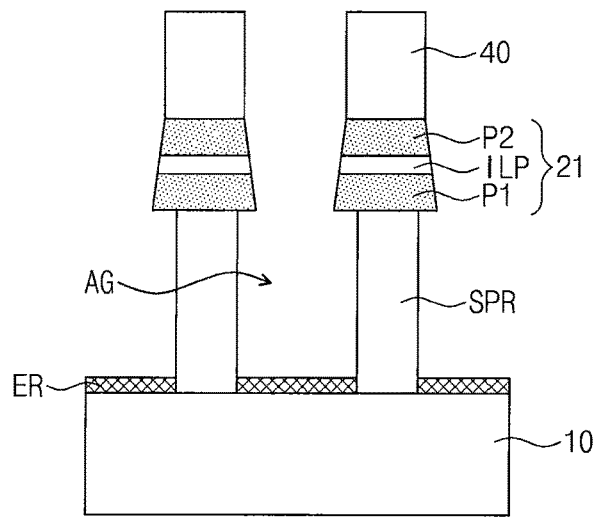

FIGS. 1 to 3 are cross-sectional views illustrating operations for manufacturing a semiconductor device according to example embodiments of the inventive concepts.

Referring to FIG. 1, a conductive layer 20 may be provided on a substrate 10. The substrate 10 may be a substrate including a selection element, such as a transistor or a diode. Conductive pillars SPR may be provided between the conductive layer 20 and the substrate 10, and a cavity, here an air gap AG, may be defined by sidewalls of the conductive pillars SPR, a top surface of the substrate 10, and a bottom surface of the conductive layer 20. The conductive pillars SPR may be arrayed in two dimensions on the substrate 10. The conductive layer 20 may include a lower conductive layer L1, an upper conductive layer L2, and an insulating layer IL disposed between the lower conductive layer L1 and the upper conductive layer L2.

Mask patterns 40 may be provided on the conductive layer 20, and a patterning of the conductive layer 20 may be performed using the mask patterns 40 as an etch mask. In some embodiments, the patterning process may include a sputtering process.

FIG. 2 illustrates that a portion of the conductive layer 20 is etched during the patterning process. FIG. 3 illustrates that the conductive layer 20 is divided into separate conductive patterns 21. Referring to FIGS. 2 and 3, the conductive layer 20 may be patterned to be divided into the separate conductive patterns 21. Each of the conductive patterns 21 may include a lower conductive pattern P1, an insulating pattern ILP, and an upper conductive pattern P2. The lower conductive pattern P1 and the upper conductive pattern P2 may be insulated from one another by the insulating pattern ILP therebetween.

As the patterning process proceeds, a recess RS may be formed in the conductive layer 20. An etch residue 30 corresponding to a by-product of the sputtering process may be formed in a lower portion of the recess RS. As the patterning process further proceeds, conductive elements in the etch residue 30 may be re-sputtered and adhere to a sidewall of the etched conductive layer 20 in the recess RS. In the event that the recess RS extends to the bottom surface of the conductive layer 20 so as to be connected to the air gap AG during the sputtering process, the etch residue 30 may fall to a bottom surface of the air gap AG (i.e., the top Surface of the substrate 10) to form an etch residue layer ER.

The amount of the conductive elements re-sputtered and adhering to the sidewall of the conductive patterns 21 is dependent on a height of a bottom surface of the recess RS. In other words, since the bottom surface of the recess RS is formed in the conductive patterns 21 at an initial stage of the patterning process, a considerable number of the re-sputtered conductive elements may adhere to the sidewalls of the conductive patterns 21. The adhered conductive elements include a metal material, so a saturated vapor pressure of the adhered conductive elements is lower than that of silicon or an insulating material. To remove the adhered conductive elements and lower the bottom surface of the recess RS, the sputtering process should be performed for a considerable time after the bottom surface of the conductive layer 20 has been penetrated. If the air gap AG does is not present under the conductive layer 20, it may be difficult to lower the bottom surface of the recess RS using the sputtering process. Additional process time may also be needed, and the sputtering process may influence structures under the recess RS.

According to some embodiments of the inventive concepts, the air gap AG is formed under the conductive layer 20 before sputtering so that the bottom surface of the recess RS may be lowered without under additional sputtering. In particular, when the bottom surface of the conductive layer 20 is penetrated and the recess RS connected to the air gap AG, etch residue 30 may fall to the bottom surface of the air gap AG (i.e., the top surface of the substrate 10) to form the etch residue layer ER. This can reduce the amount of the conductive elements adhering to the sidewalls of the conductive patterns 21 and thus reduce the likelihood of a short developing between the lower conductive pattern P1 and the upper conductive pattern P2. It is also possible to reduce an increase of widths of the conductive patterns 21 which may be caused by the re-sputtered conductive elements, so that the likelihood of a short developing between adjacent conductive patterns 21 may be reduced.

Figure 4:
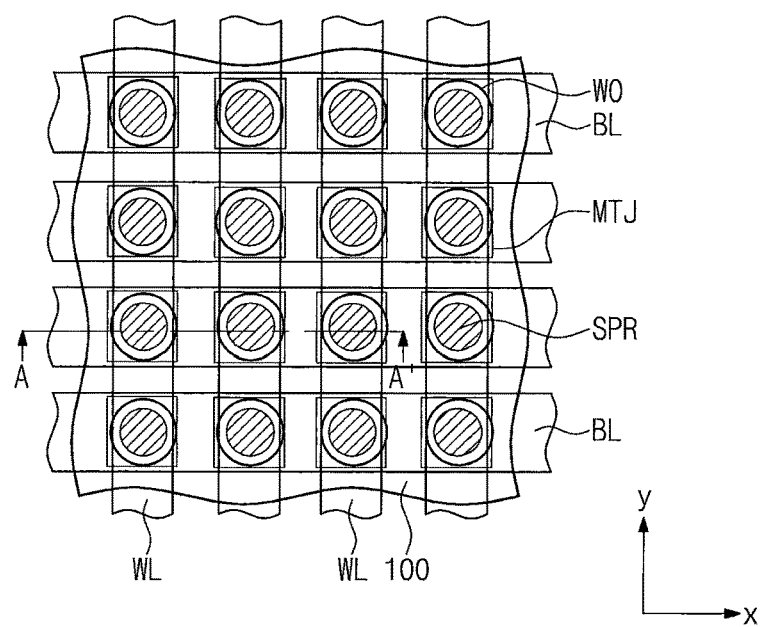
FIG. 4 is a plan view illustrating a magnetic memory device according to some embodiments of the inventive concepts.

FIG. 4 is a plan view illustrating a magnetic memory device according to some embodiments of the inventive concepts. FIGS. 5 to 13 are cross-sectional views taken along a line A-A' of FIG. 4 to illustrate operations for manufacturing a magnetic memory device according to some embodiments of the inventive concepts. Hereinafter, for the purpose of clarity and brevity in explanation, a magnetic memory device will be described as an example of the semiconductor device of the inventive concepts. However, embodiments of the inventive concepts are not limited thereto.

Figure 5:
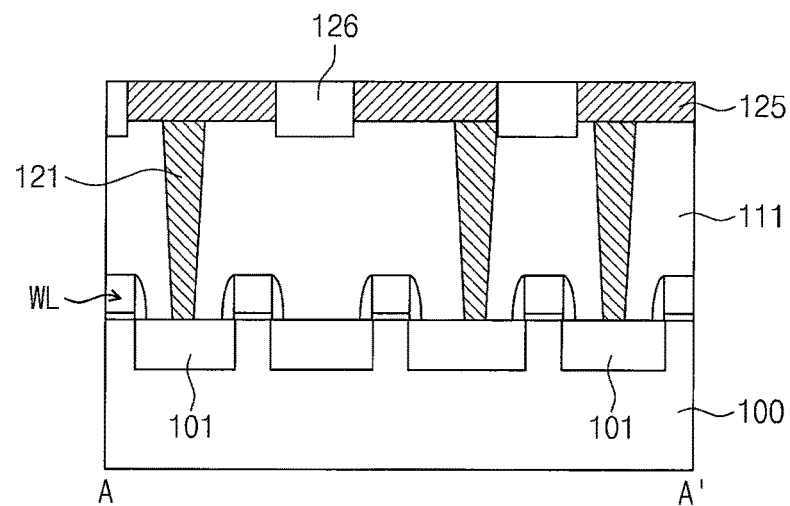
FIGS. 5 to 13 are cross-sectional views taken along a line A-A' of FIG. 4 that illustrate operations for manufacturing a magnetic memory device according to some embodiments of the inventive concepts.

Referring to FIGS. 4 and 5, selection elements may be formed on a substrate 100. In some embodiments, the selection elements may be transistors. The transistors may include word lines WL on the substrate 100 and source/drain regions 101 formed in the substrate 100 between the word lines WL. The word lines WL may be spaced apart along in a first direction (hereinafter, referred to as 'an x-direction') and may longitudinally extend in a second direction (hereinafter, referred to as 'a y-direction). Each of the word lines WL may include a gate electrode and a gate dielectric layer. In some embodiments, the gate electrode may include a doped semiconductor and/or a metal material. In some embodiments, the gate dielectric layer may include a thermal oxide layer. A spacer may be provided on a sidewall of the gate electrode. For example, the spacer may include at least one of an oxide layer (e.g., a silicon oxide layer), an oxynitride layer (e.g., a silicon oxynitride layer), and a nitride layer (e.g., a silicon nitride layer). In FIGS. 4 and 5, the word lines WL are disposed on a top surface of the substrate 100. Alternatively, the word lines WL may be buried in the substrate 100.

A first interlayer insulating layer 111 may be formed to cover the word lines WL, and contacts 121 may be formed to penetrate the first interlayer insulating layer 111. The contacts 121 may be connected to the source/drain regions 101. For example, the first interlayer insulating layer 111 may include a silicon oxide layer and may be formed by a chemical vapor deposition (CVD) process. The contacts 121 may be structures connecting the source/drain regions 101 to magnetic tunnel junction structures that will be described later. Even though not shown in the drawings, some of the source/drain regions 101 not connected to the contacts 121 may be connected to source contacts. The contacts 121 may include, for example, at least one of a metal, a conductive metal nitride, and a doped semiconductor material.

Conductive pads 125 may be connected to respective ones of the contacts 121. The conductive pads 125 may be formed by forming a conductive layer on the contacts 121, followed by forming a filling insulating layer 126 penetrating the conductive layer. After the formation of the filling insulating layer 126, a planarization process may be performed on the filling insulating layer 126 to expose top surfaces of the conductive pads 125. Alternatively, an insulating layer including recesses may be formed on the contacts 121, and the conductive pads 125 may be then formed in the recesses. The conductive pads 125 may include at least one of, for example, a metal, a conductive metal nitride, and a doped semiconductor material. The filling insulating layer 126 may include at least one of, for example, silicon oxide, silicon nitride, and silicon oxynitride.

Figure 6:
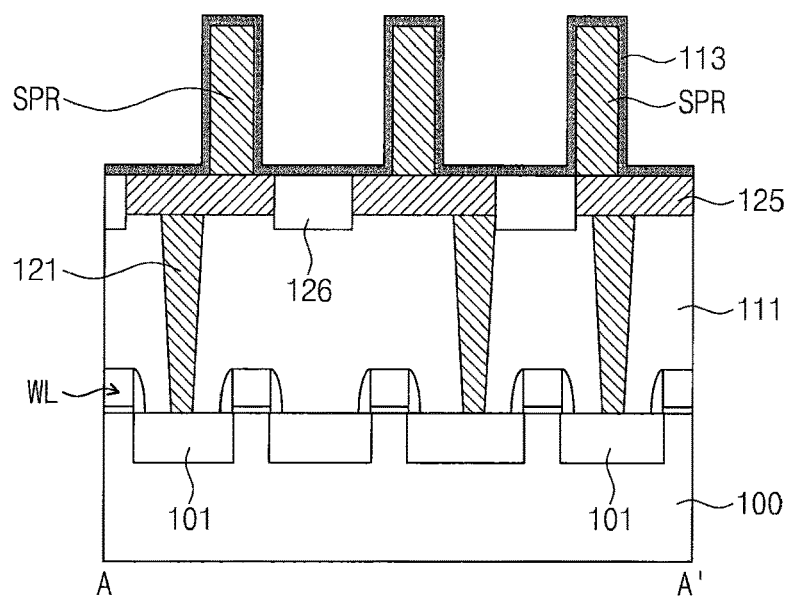

Referring to FIGS. 4 and 6, conductive pillars SPR may be formed on the conductive pads 125. In some embodiments, a conductive layer may be deposited on the conductive pads 125, and the deposited conductive layer may be then patterned to form the conductive pillars SPR. In other embodiments, an insulating layer having recesses therein may be formed on the conductive pads 125, and the recesses may be filled with a conductive material to form the conductive pillars SPR. The conductive pillars SPR may be formed, for example, from at least one of a metal, a conductive metal nitride, and a doped semiconductor material. In some embodiments, the conductive pillars SPR may include titanium nitride and/or tungsten. The conductive pillars SPR may be arrayed in two dimensions on the substrate 100.

A vertical extent of the conductive pillars SPR may be smaller than a vertical extent of the contacts 121. For example, the vertical extent of the conductive pillars SPR may be in a range of about 400 Å to about 1200 Å. A height of an air gap described below may be determined depending on the vertical extent of the conductive pillars SPR. Distances between the conductive pillars SPR are equal to each other in FIG. 6. However, the inventive concepts are not limited thereto.

A capping insulating layer 113 may be formed on the substrate 100 having the conductive pillars SPR. The capping insulating layer 113 may substantially conform to sidewalls and top surfaces of the conductive pillars SPR and a top surface of the filling insulating layer 126. The capping insulating layer 113 may include, for example, silicon nitride or silicon oxynitride.

Figure 7:
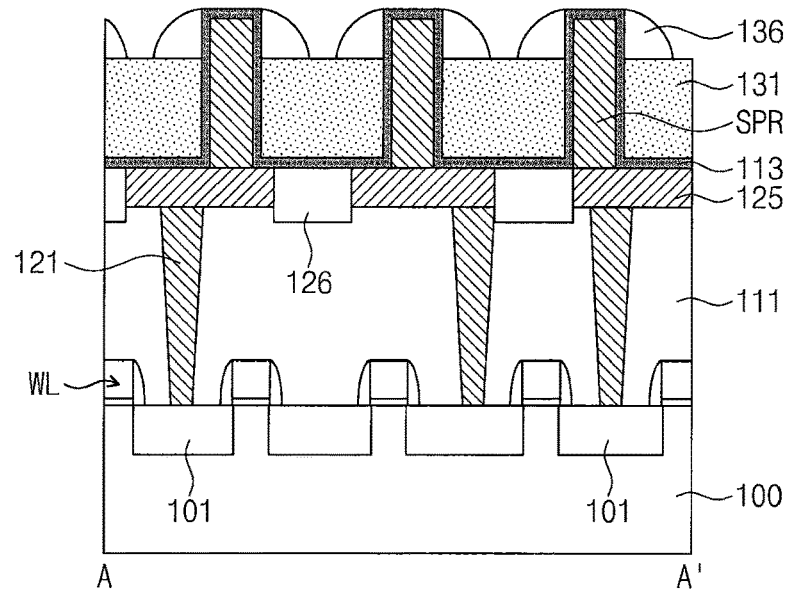

Referring to FIGS. 4 and 7, a sacrificial layer 131 may be formed between the conductive pillars SPR. In some embodiments, the sacrificial layer 131 may include silicon organic hybrid (SOH). In some embodiments, the sacrificial layer 131 may include a material having an etch selectivity with respect to a mold structure described below.

The sacrificial layer 131 may be formed by a CVD process. The sacrificial layer 131 may have a top surface lower than the top surfaces of the conductive pillars SPR. In some embodiments, the process of forming the sacrificial layer 131 may include a recessing process performed until the top surface of the sacrificial layer 131 becomes lower than the top surfaces of the conductive pillars SPR.

First mold patterns 136 may be formed on the substrate 100 having the sacrificial layer 131. The first mold patterns 136 may include a material having an etch selectivity with respect to the sacrificial layer 131. In some embodiments, if the sacrificial layer 131 includes silicon oxide, the first mold patterns 136 may include silicon nitride. In some embodiments, the sacrificial layer 131 may include poly-silicon, and the first mold patterns 136 may include silicon oxide or silicon nitride.

Each of the first mold patterns 136 may be formed on a sidewall of an upper portion of each of the conductive pillars SPR with the capping insulating layer 113 therebetween. In some embodiments, an insulating layer may be formed on the substrate 100 having the sacrificial layer 131, and a dry etching process may be then performed on the insulating layer to form the first mold patterns 136 having sidewall spacer-like shapes. Each of the first mold patterns 136 may be ring shaped, surrounding a corresponding one of the conductive pillars SPR when viewed from a plan view. Portions of the sacrificial layer 131 may be exposed between the first mold patterns 136.

Figure 8:
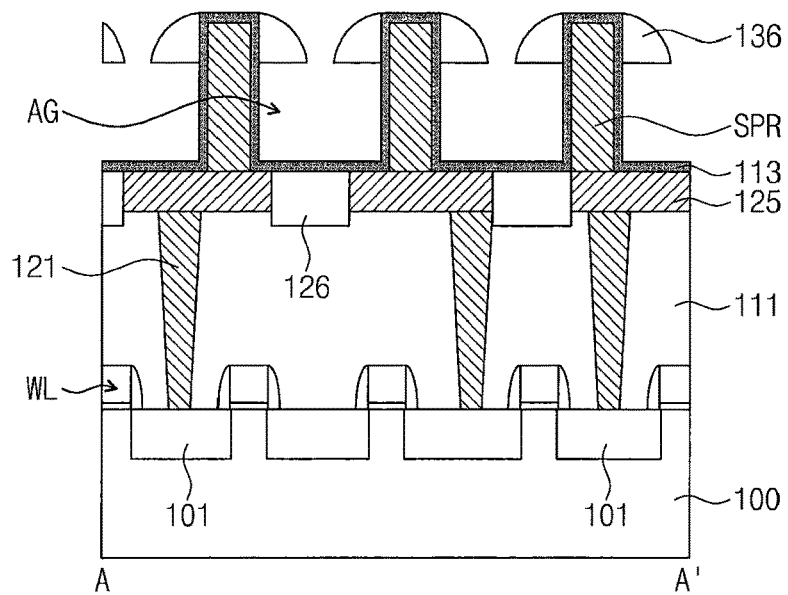

Referring to FIGS. 4 and 8, the sacrificial layer 131 may be removed to form air gaps AG. In some embodiments, the sacrificial layer 131 may be removed through spaces between the first mold patterns 136. If the sacrificial layer 131 includes SOH, an ashing process and/or an ultraviolet irradiation process may be used to remove the sacrificial layer 131. If the sacrificial layer 131 has the etch selectivity with respect to the first mold patterns 136, the sacrificial layer 131 may be removed using a selective etching process. The first mold patterns 136 are not removed and remain after removal of the sacrificial layer 131.

Figure 9:
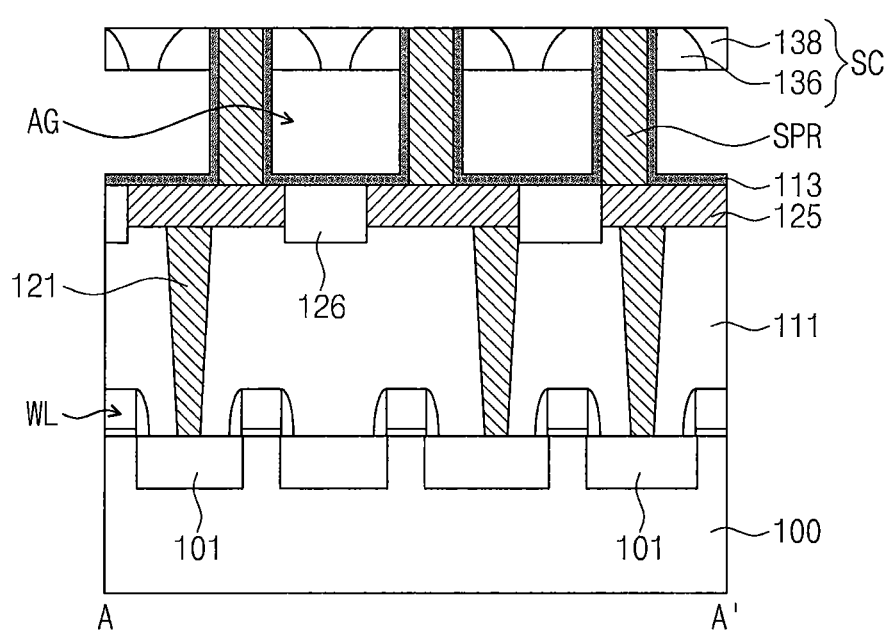

Referring to FIGS. 4 and 9, second mold patterns 138 may be formed between the first mold patterns 136. The second mold patterns 138 may include the same material(s) as the first mold patterns 136. In some embodiments, the second mold patterns 138 may be formed by an atomic layer deposition (ALD) process. In some embodiments, the second mold patterns 138 may be formed of an insulating material having poor step coverage. For example, the second mold patterns 138 may be formed by a plasma-enhanced CVD process or a physical vapor deposition (PVD) process. The air gap AG is not filled by the second mold patterns 138. The formation of the second mold patterns 138 may include planarization to expose top surfaces of the conductive pillars SPR. Upper portions of the first mold patterns 136 and an upper portion of the capping insulating layer 113 may be removed by the planarization process. As a result, a mold structure SC including the first and second mold patterns 136 and 138 may be formed, bounding the air gap AG between the conductive pillars SPR.

Figure 10:
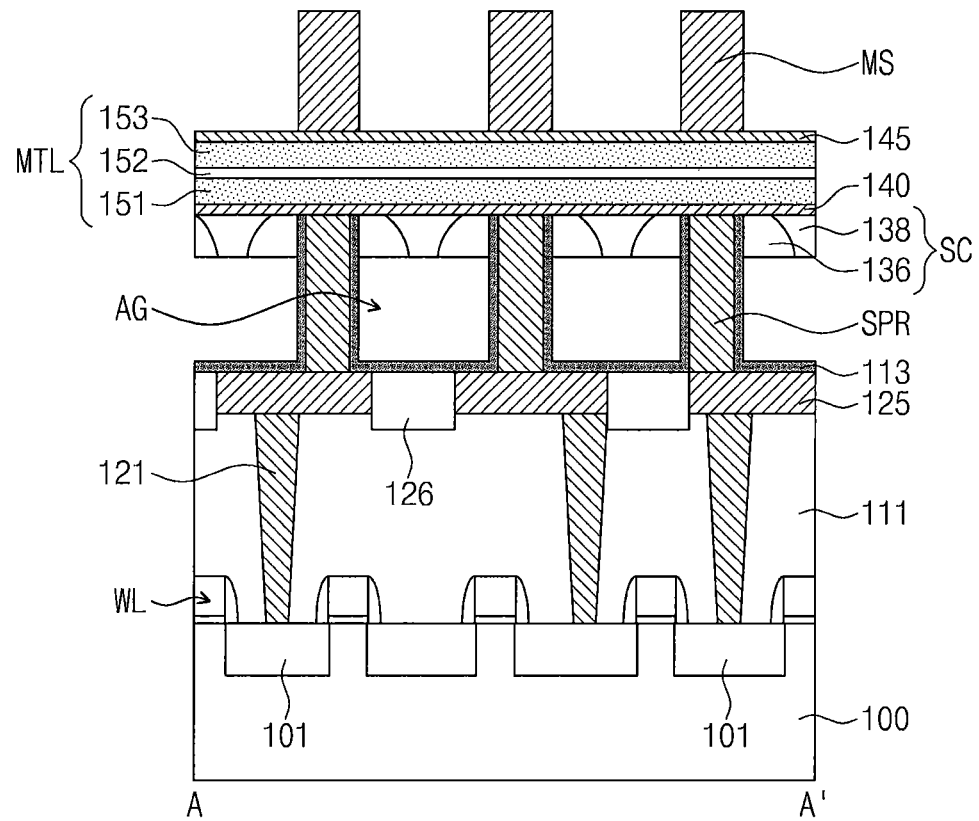

Referring to FIGS. 4 and 10, a lower electrode layer 140, a magnetic tunnel junction layer MTL, and an upper electrode layer 145 may be sequentially formed on the mold structure SC. The lower and upper electrode layers 140 and 145 may include, for example, at least one of a metal, a conductive metal nitride, and a doped semiconductor material. The magnetic tunnel junction layer MTL may include a first magnetic layer 151, a tunnel insulating layer 152, and a second magnetic layer 153. The magnetic tunnel junction layer MTL will be described in more detail with reference to FIGS. 34 and 35.

Conductive mask patterns MS may be formed on the upper electrode layer 145. The conductive mask patterns MS may include, for example, tungsten and/or titanium nitride. The conductive mask patterns MS may be substantially aligned with the conductive pillars SPR.

Figure 11:
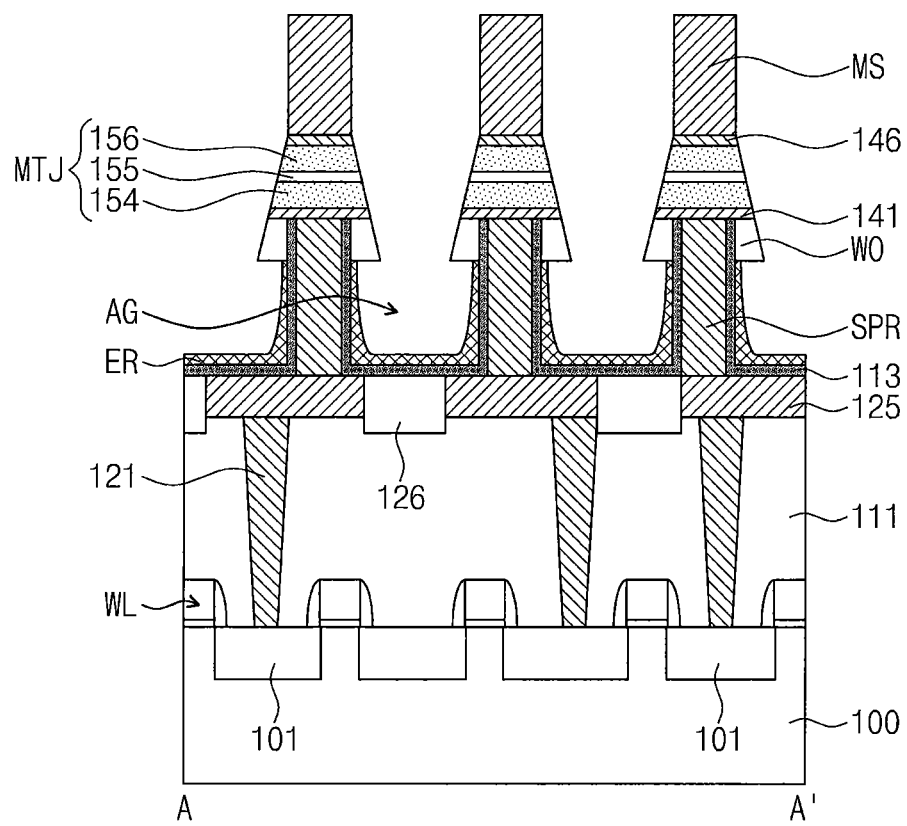

Referring to FIGS. 4 and 11, the magnetic tunnel junction layer MTL and the upper and lower electrode layers 140 and 145 may be patterned using the conductive mask patterns MS as an etch mask. In some embodiments, the patterning process using the conductive mask patterns MS may include a sputtering process. Lower electrode patterns 141, magnetic tunnel junction structures MTJ, and upper electrode patterns 146 may be formed. Each of the magnetic tunnel junction structures MTJ may include a first magnetic pattern 154, a tunnel insulating pattern 155, and a second magnetic pattern 156. During the patterning process, the air gap AG may be exposed and a conductive etch residue layer ER may be formed in a lower portion of the air gap AG, as described above with reference to FIGS. 1 to 3. The conductive etch residue layer ER may include a by-product of the sputtering process used in patterning the magnetic tunnel junction layer MTL and the upper and lower electrode layers 140 and 145.

During the patterning process, the mold structure SC may also be etched to form residual mold patterns WO under the magnetic tunnel junction structures MTJ. The residual mold patterns WO may be ring shaped, surrounding the conductive pillars SPR when viewed from a plan view. A sidewall of the residual mold pattern WO may be coplanar with a sidewall of the magnetic tunnel junction structure MTJ. The conductive etch residue layer ER may extend from a bottom surface of the air gap AG to bottom surfaces of the residual mold patterns WO. However, the inventive concepts are not limited thereto.

Figure 12:
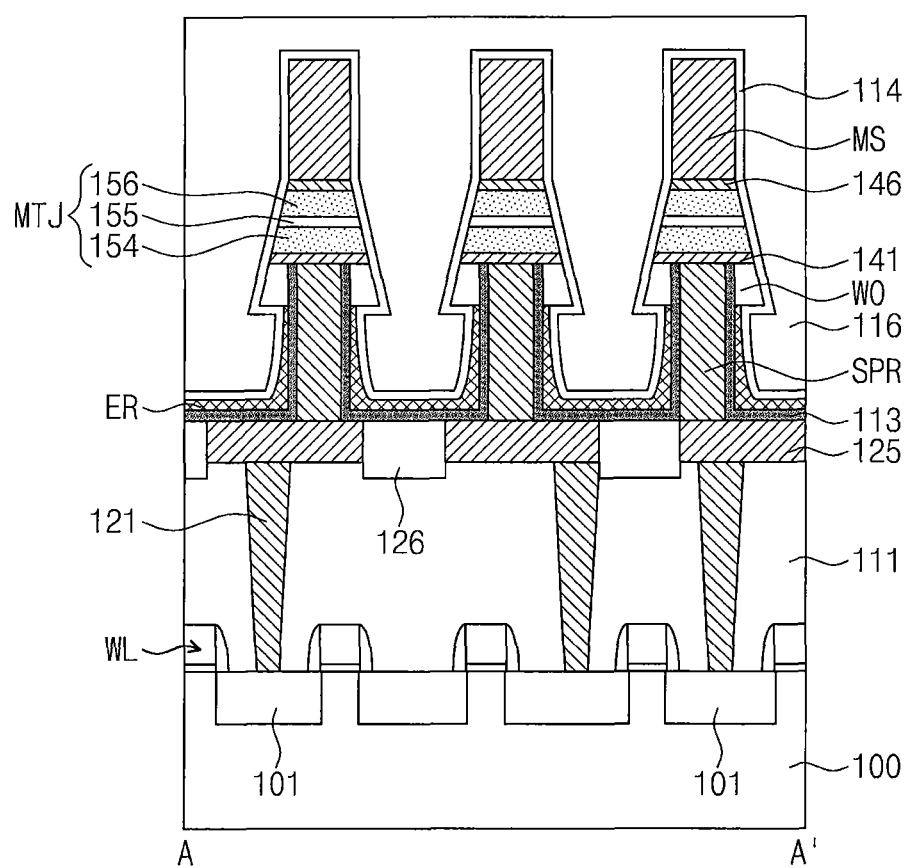

Referring to FIGS. 4 and 12, a protection insulating layer 114 and a second interlayer insulating layer 116 may be sequentially formed on the substrate 100 having the magnetic tunnel junction structures MTJ. The protection insulating layer 114 may include a material different from that of the residual mold patterns WO. For example, the protection insulating layer 114 may include silicon nitride, silicon oxynitride and/or aluminum oxide. The second interlayer insulating layer 116 may include, for example, silicon oxide. The protection insulating layer 114 and the second interlayer insulating layer 116 may be formed by CVD processes.

Figure 13:
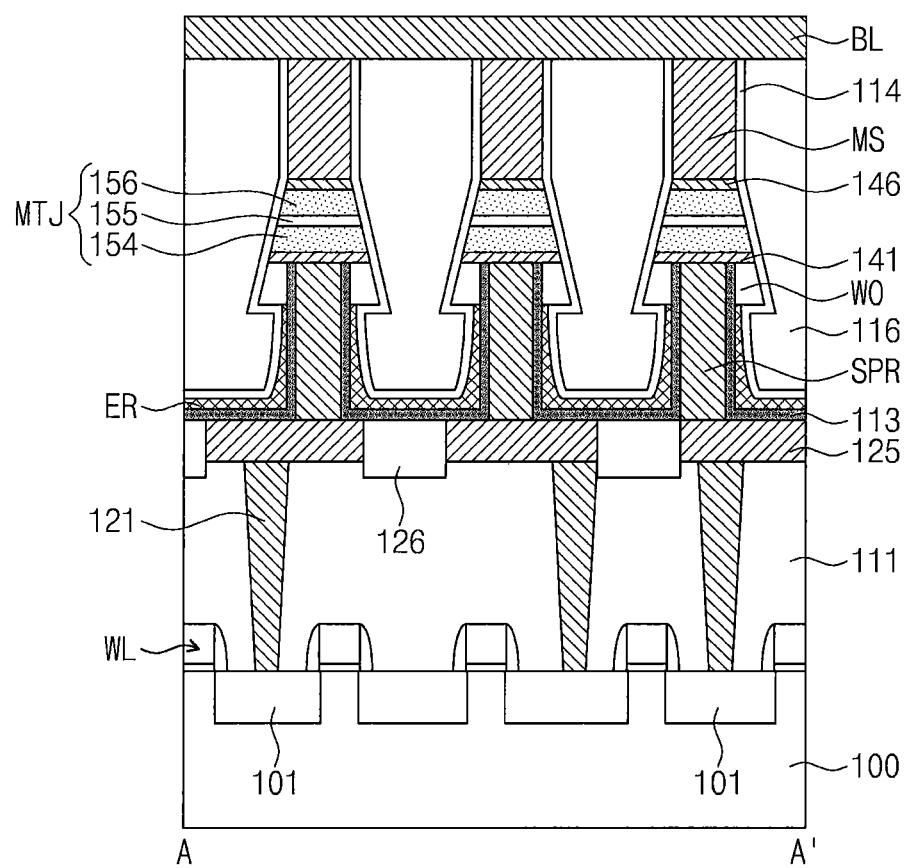

Referring to FIGS. 4 and 13, a planarization process may be performed to expose top surfaces of the conductive mask patterns MS. During the planarization process, the protection insulating layer 114 and the second interlayer insulating layer 116 may be partially removed. Bit lines BL may be formed on the exposed conductive mask patterns MS. The bit lines BL may be spaced apart from each other in the y-direction and may longitudinally extend in the x-direction. For example, the bit lines BL may be formed of a metal and/or a conductive metal nitride.

A magnetic memory device according to some embodiments will be described with reference to FIGS. 4 and 13.

Selection elements may be provided on a substrate 100. For example, the selection elements may be transistors. The transistors may include word lines WL and source/drain regions 101 formed in the substrate 100 between the word lines WL. The word lines WL may be arranged in an x-direction and may longitudinally extend in a y-direction intersecting the x-direction.

Contacts 121 may penetrate a first interlayer insulating layer 111 covering the word lines WL and contact the source/drain regions 101. The first interlayer insulating layer 111 may include, for example, a silicon oxide layer. The contacts 121 may include, for example, at least one of a metal, a conductive metal nitride, and a doped semiconductor material.

Conductive pads 125 may be connected to respective ones of the contact 121. The conductive pads 125 may be separated from each other by a filling insulating layer 126. The conductive pads 125 may include, for example, at least one of a metal, a conductive metal nitride, and a doped semiconductor material. The filling insulating layer 126 may include, for example, at least one of silicon oxide, silicon nitride, and silicon oxynitride.

Conductive pillars SPR may be provided on the conductive pads 125. The conductive pillars SPR may be arrayed in two dimensions along the x-direction and the y-direction (see FIG. 4). The conductive pillars SPR may include, for example, at least one of a metal, a conductive metal nitride, and a doped semiconductor material. For example, the conductive pillars SPR may include titanium nitride and/or tungsten. A vertical extent of the conductive pillars SPR may be greater than a thickness of a magnetic tunnel junction structure MTJ described below and smaller than a vertical extent of the contacts 121. For example, the vertical extent of the conductive pillars SPR may be in a range from about 400 Å to about 1200 Å.

A capping insulating layer 113 may be provided on sidewalls of the conductive pillars SPR. The capping insulating layer 113 may extend from the sidewalls of the conductive pillars SPR onto a top surface of the filling insulating layer 126. The capping insulating layer 113 may include, for example, silicon nitride and/or silicon oxynitride.

A lower electrode pattern 141, a magnetic tunnel junction structure MTJ, and an upper electrode pattern 146 may be sequentially provided on each of the conductive pillars SPR. The capping insulating layer 113 may be in contact with bottom surfaces of the lower electrode patterns 141. The lower electrode pattern 141, the magnetic tunnel junction structure MTJ, and the upper electrode pattern 146 may have sidewalls that are substantially coplanar. The magnetic tunnel junction structure MTJ will be described in more detail with reference to FIGS. 34 and 35.

Conductive mask patterns MS may be provided on the magnetic tunnel junction structures MTJ, and bit lines BL may be provided on the conductive mask patterns MS. The magnetic tunnel junction structures MTJ may be electrically connected to the bit lines BL through the conductive mask patterns MS. The conductive mask patterns MS may include a metal and/or a conductive metal nitride.

A protection insulating layer 114 may be provided on sidewalls of the conductive mask patterns MS, the upper and lower electrode patterns 141 and 146, the magnetic tunnel junction structures MTJ, and the conductive pillars SPR. A second interlayer insulating layer 116 may be provided on the protection insulating layer 114 between the magnetic tunnel junction structures MTJ. The protection insulating layer 114 may include, for example, silicon oxide, silicon oxynitride and/or aluminum oxide. The second interlayer insulating layer 116 may include, for example, a silicon oxide layer.

Residual mold patterns WO may be provided under bottom surfaces of the lower electrode patterns 141, respectively. Each of the residual mold patterns WO may be provided between the protection insulating layer 114 and an upper portion of each of the conductive pillars SPR. The residual mold patterns WO may be ring shaped and surround outer sidewalls of the conductive pillars SPR. A sidewall of the residual mold pattern WO may be substantially coplanar with the sidewalls of the lower electrode pattern 141 and the magnetic tunnel junction structure MTJ disposed on the residual mold pattern WO. Bottom surfaces of the residual mold patterns WO may be higher than bottom surfaces of the conductive pillars SPR. The residual mold patterns WO may include a material different from that of the protection insulating layer 114. For example, the residual mold patterns WO may include silicon oxide.

A conductive etch residue layer ER may be disposed between the adjacent ones of the conductive pillars SPR. The conductive etch residue layer ER may be disposed between the protection insulating layer 114 and the capping insulating layer 113. The conductive etch residue layer ER may include a lower portion and an upper portion extending from the lower portion onto the sidewalls of the conductive pillars SPR. A top surface of the conductive etch residue layer ER may be in contact with the bottom surfaces of the residual mold patterns WO, as illustrated in FIG. 13. However, the inventive concepts are not limited thereto. Since the conductive etch residue layer ER is a residue of the sputtering process performed for the formation of the magnetic tunnel junction structures MTJ, the conductive etch residue layer ER may include the same conductive elements as ingredients of the magnetic tunnel junction structures MTJ.

Figure 14:
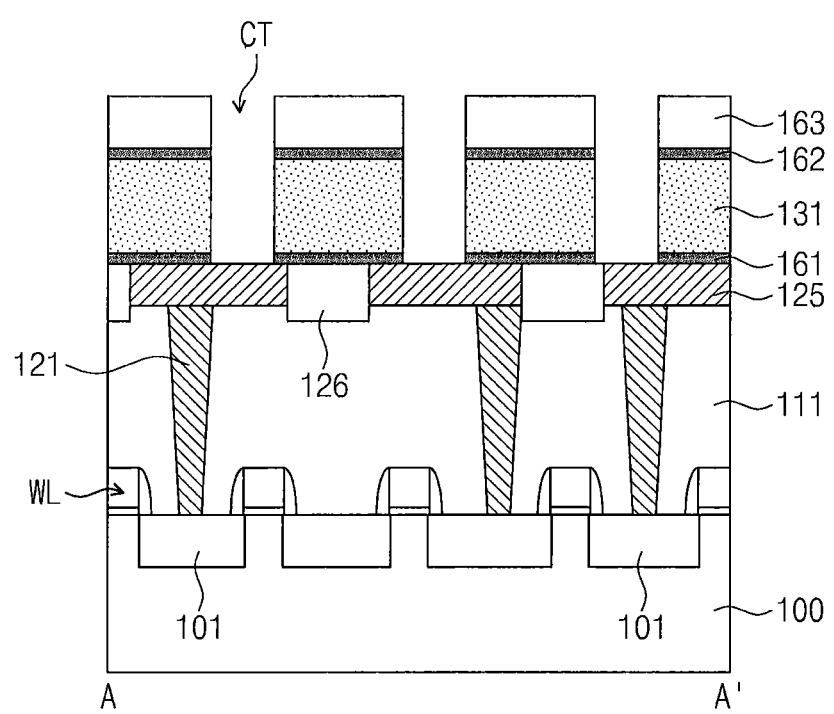
FIGS. 14 to 16 are cross-sectional views taken along a line A-A' of FIG. 4 that illustrate operations for manufacturing a magnetic memory device according to some embodiments of the inventive concepts.
Figure 15:
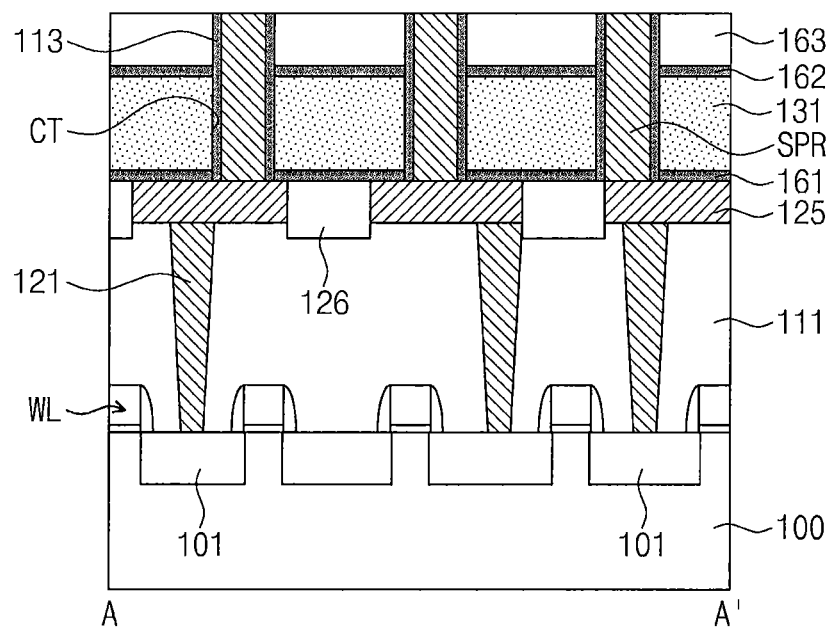
Figure 16:
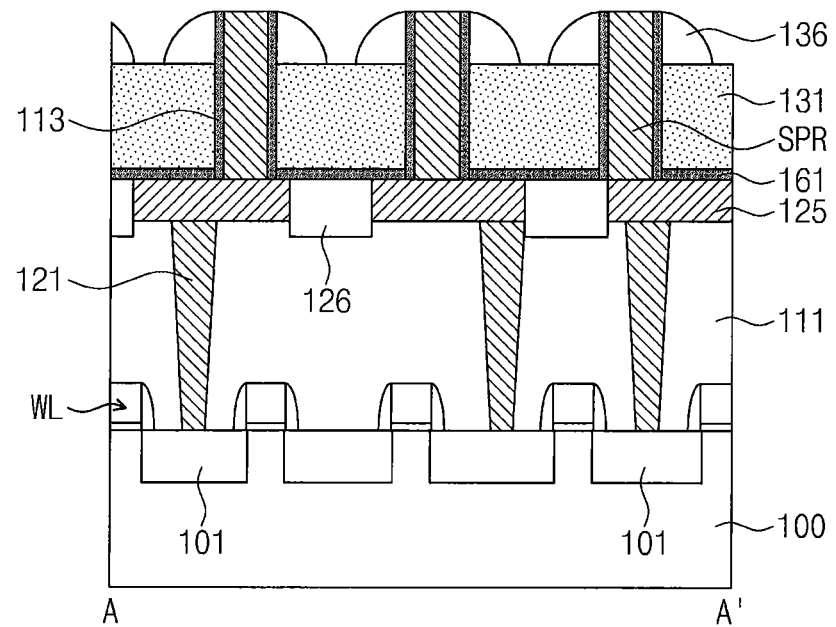

FIGS. 14 to 16 are cross-sectional views taken along a line A-A' of FIG. 4 to illustrate operations for manufacturing a magnetic memory device according to some embodiments of the inventive concepts. In these embodiments, descriptions of the same components described in the aforementioned embodiment will not be repeated or will be mentioned briefly for the purpose of clarity and brevity in explanation.

Referring to FIG. 14, a pad insulating layer 161, a sacrificial layer 131, an etch stop layer 162, and an upper insulating layer 163 may be sequentially formed on the structure described with reference to FIG. 5. The pad insulating layer 161 may include, for example, silicon nitride. The sacrificial layer 131 may include, for example, at least one of SOH, silicon oxide, and silicon oxynitride. The etch stop layer 162 may include, for example, silicon nitride. The upper insulating layer 164 may include, for example, silicon oxide.

Contact holes CT may be formed penetrating the upper insulating layer 163, the etch stop layer 162, the sacrificial layer 131, and the pad insulating layer 161. The contact holes CT may be arrayed in two dimensions on the substrate 100.

Referring to FIG. 15, a capping insulating layer 113 may be formed on a sidewalls of the upper insulating layer 163, the etch stop layer 162, the sacrificial layer 131, and the pad insulating layer 161 in the contact hole CT. An insulating layer may be formed on the substrate 100 having the contact hole CT, and a dry etching process may be then performed on the insulating layer to form the capping insulating layer 113 and leave the conductive pads 125 exposed.

Conductive pillars SPR may be formed in the contact holes CT. The conductive pillars SPR may include a metal and/or a conductive metal nitride.

Referring to FIG. 16, the upper insulating layer 163 may be removed. The sacrificial layer 131 may be protected by the etch stop layer 162 when the upper insulating layer 163 is removed. The etch stop layer 162 may be removed together with the upper insulating layer 163 or may be removed by an additional etching process.

First mold patterns 136 may be formed on sidewalls of upper portions of the conductive pillars SPR. In some embodiments, an insulating layer may be formed on a resultant structure from which the upper insulating layer 163 is removed, and a dry etching process may be performed on the insulating layer to form the first mold patterns 136 having spacer-shapes. Thereafter, the same processes described with reference to FIGS. 9 to 13 may be performed.

FIGS. 17 to 22 are cross-sectional views taken along a line A-A' of FIG. 4 to illustrate operations for manufacturing a magnetic memory device according to further embodiments of the inventive concepts. In the present embodiments, descriptions to the same components as described in the aforementioned embodiments will not be repeated or will be mentioned briefly for the purpose of clarity and brevity in explanation.

Figure 17:
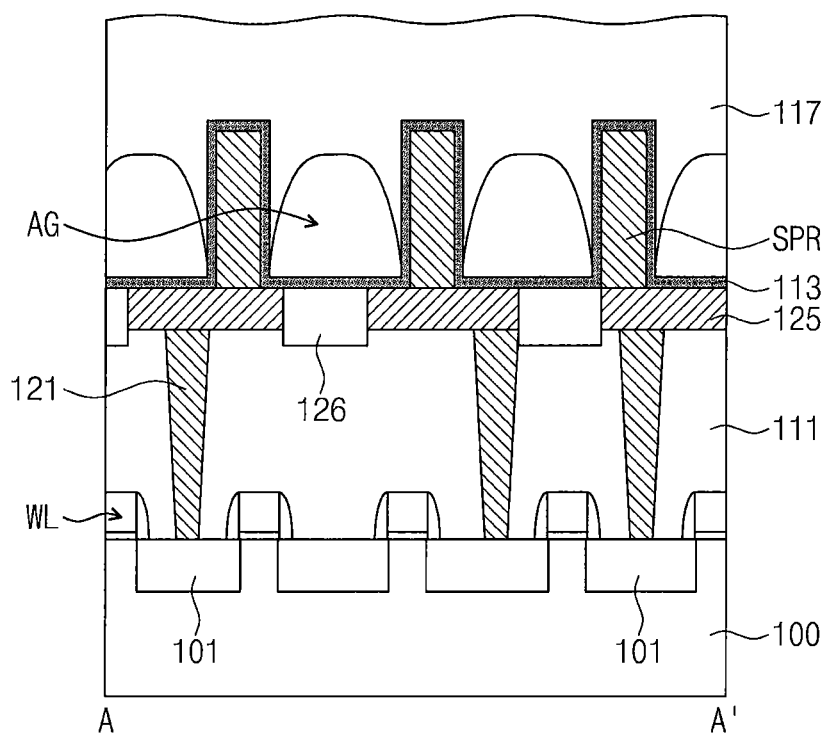
FIGS. 17 to 22 are cross-sectional views taken along a line A-A' of FIG. 4 that illustrate operations for manufacturing a magnetic memory device according to some embodiments of the inventive concepts.

Referring to FIG. 17, a mold insulating layer 117 may be formed on the structure described with reference to FIG. 6. The mold insulating layer 117 may be formed of a material having poor step coverage. For example, the mold insulating layer 117 may be formed by a plasma-enhanced CVD process or a PVD process. Thus, an air gap AG may be formed between the conductive pillars SPR. A top surface of the mold insulating layer 117 may have an uneven shape due to shapes (e.g., heights) of the conductive pillars SPR. A top of the air gap AG may be lower than the top surfaces of the conductive pillars SPR.

Figure 18:
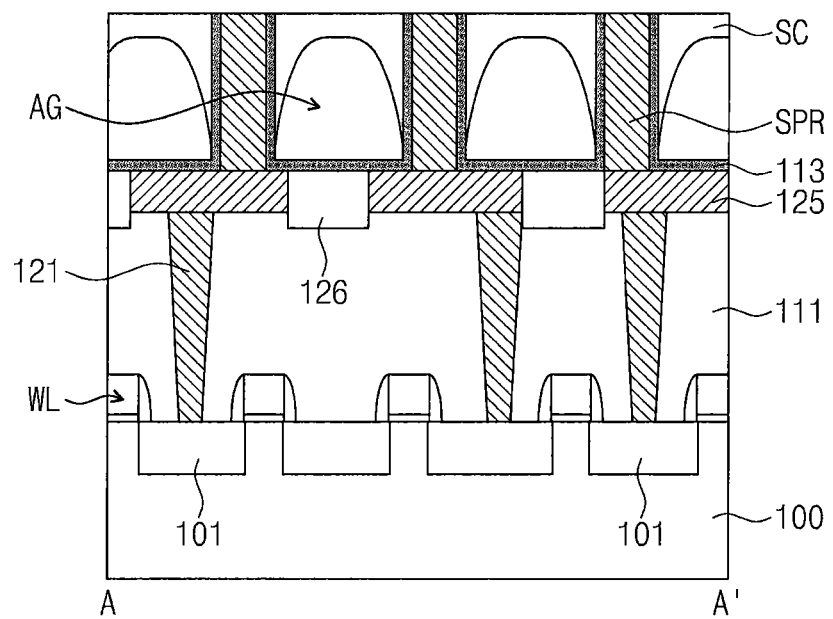

Referring to FIG. 18, a planarization process may be performed on the mold insulating layer 117 until the top surfaces of the conductive pillars SPR are exposed, thus leaving a mold structure SC formed from the mold insulating layer 117. Portions of the capping insulating layer 113, which are formed on the top surfaces of the conductive pillars SPR, may be removed during the planarization process.

Figure 19:
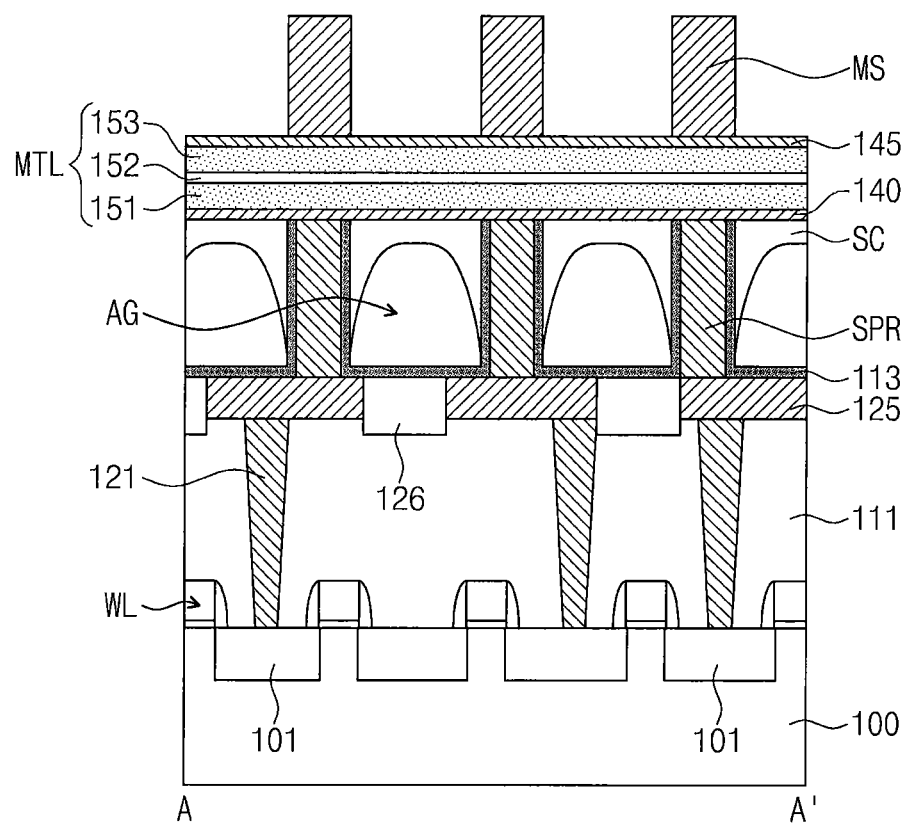

Referring to FIG. 19, a lower electrode layer 140, a magnetic tunnel junction layer MTL, and an upper electrode layer 145 may be sequentially formed on the mold structure Sc. The lower and upper electrode layers 140 and 145 may include, for example, at least one of a conductive metal nitride and a doped semiconductor material. The magnetic tunnel junction layer MTL may include a first magnetic layer 151, a tunnel insulating layer 152, and a second magnetic layer 153. Conductive mask patterns MS may be formed on the upper electrode layer 145. The conductive mask patterns MS may include, for example, tungsten and/or titanium nitride. The conductive mask patterns MS may be substantially aligned with the conductive pillars SPR.

Figure 20:
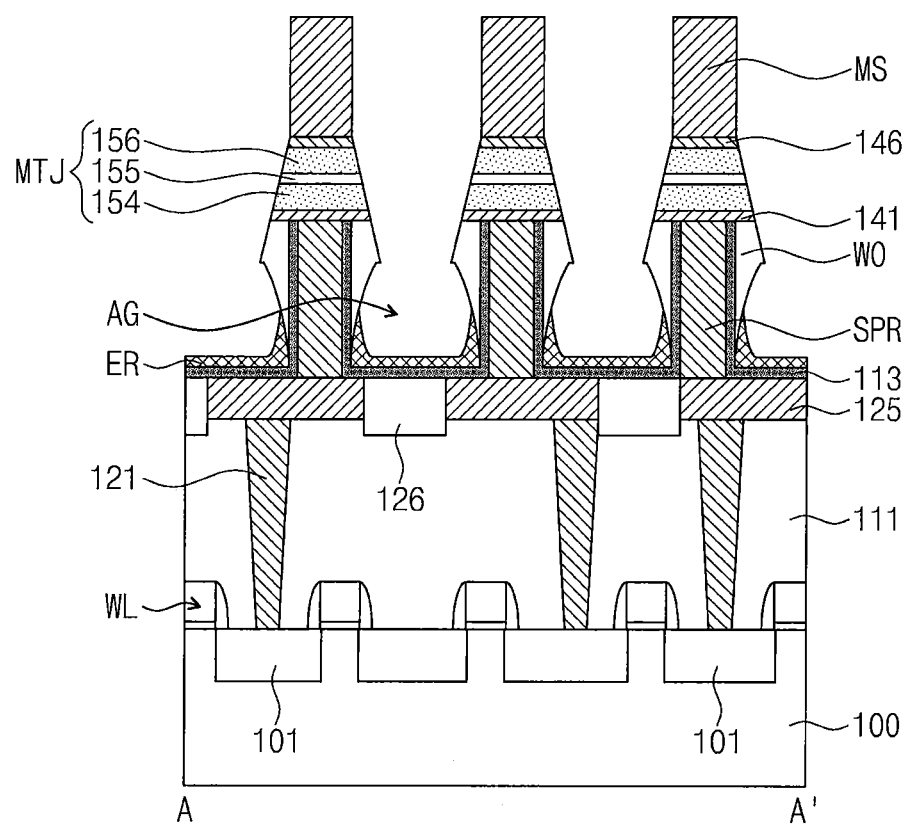

Referring to FIG. 20, the magnetic tunnel junction layer MTL and the upper and lower electrode layers 140 and 145 may be patterned using the conductive mask patterns MS as an etch mask. In some embodiments, the patterning process using the conductive mask patterns MS may include a sputtering process. As a result, lower electrode patterns 141, magnetic tunnel junction structures MTJ, and upper electrode patterns 146 may be formed. During the patterning process, the air gap AG may be exposed and a conductive etch residue layer ER may be formed in a lower portion of the air gap AG, as described above with reference to FIGS. 1 to 3. The conductive etch residue layer ER includes a by-product of the sputtering process used in patterning the magnetic tunnel junction layer MTL and the upper and lower electrode layers 140 and 145.

During the patterning process, the mold structure SC may also be etched to form residual mold patterns WO under the magnetic tunnel junction structures MTJ. The residual mold patterns WO may be ring shaped and surround the conductive pillars SPR when viewed from a plan view. The conductive etch residue layer ER may cover portions of the residual mold patterns WO. However, the inventive concepts are not limited thereto.

Figure 21:
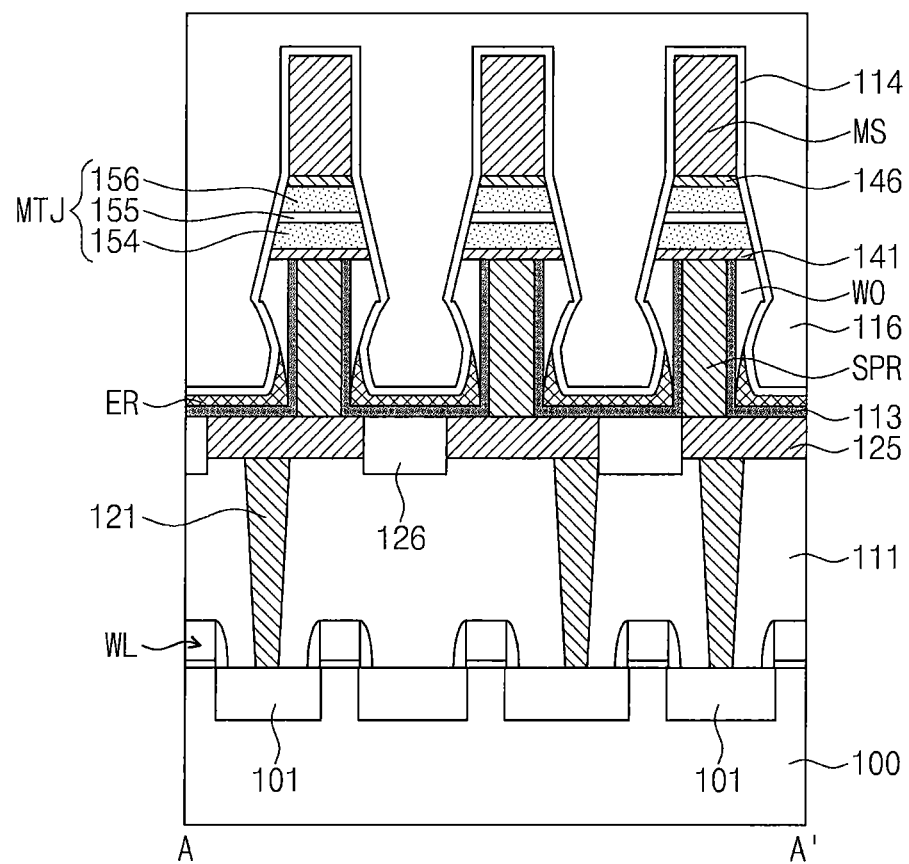

Referring to FIG. 21, a protection insulating layer 114 and a second interlayer insulating layer 116 may be sequentially formed on the substrate 100 having the magnetic tunnel junction structures MTJ. The protection insulating layer 114 may include a material different from that of the residual mold patterns WO. For example, the protection insulating layer 114 may include silicon nitride, silicon oxynitride, and/or aluminum oxide. The second interlayer insulating layer 116 may be formed of, for example, silicon oxide. The protection insulating layer 114 and the second interlayer insulating layer 116 may be formed by CVD processes.

Figure 22:
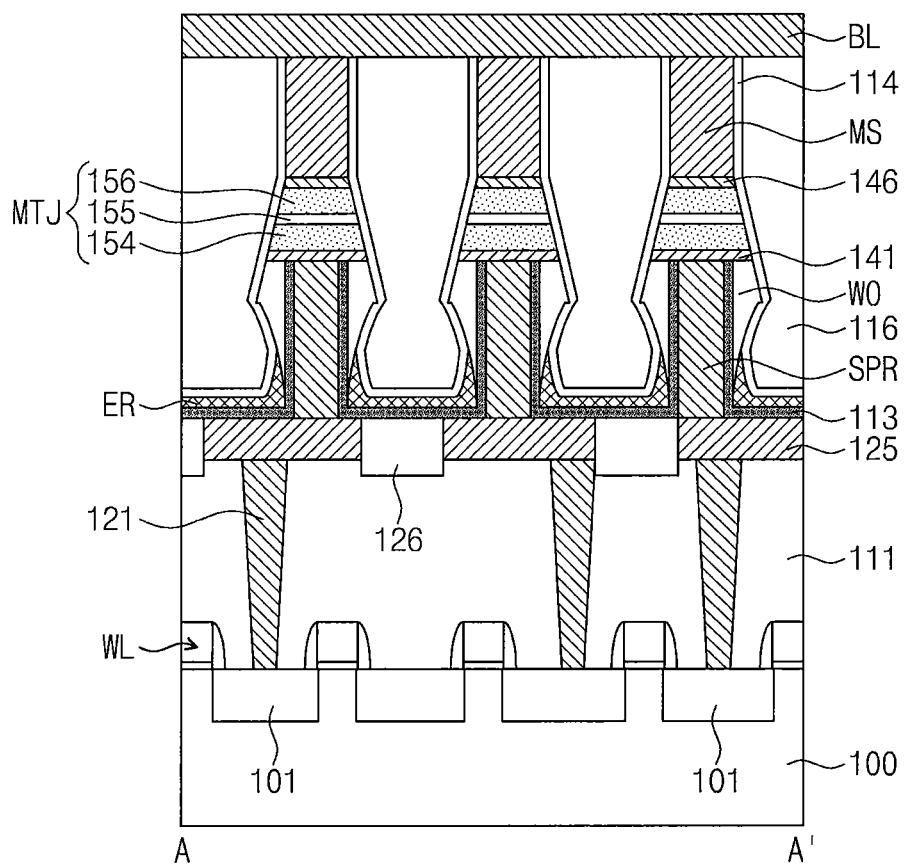

Referring to FIG. 22, a planarization process may be performed to expose top surfaces of the conductive mask patterns MS. During the planarization process, the protection insulating layer 114 and the second interlayer insulating layer 116 may be partially removed. Bit lines BL may be formed on the exposed conductive mask patterns MS. The bit lines BL may be spaced apart from each other in the y-direction and may extend longitudinally in the x-direction. The bit lines BL may be formed, for example, of a metal and/or a conductive metal nitride.

Figure 23:
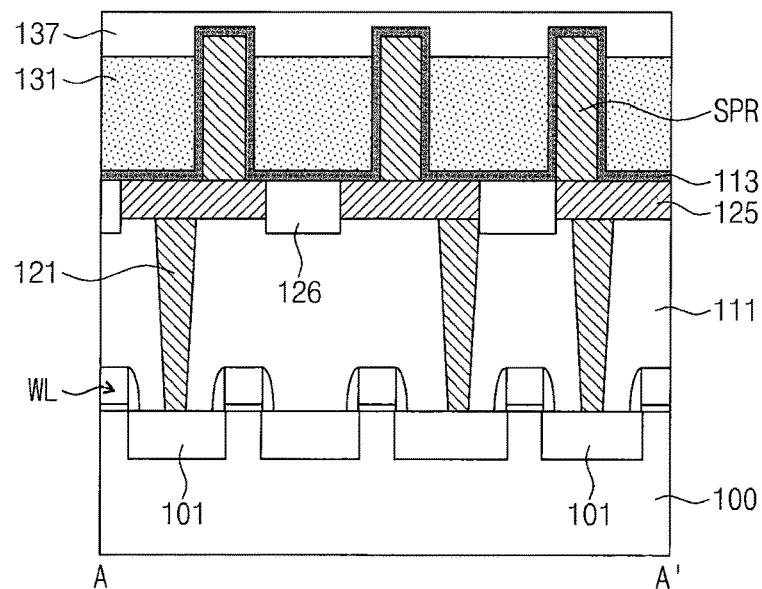
FIGS. 23 to 25 are cross-sectional views taken along a line A-A' of FIG. 4 that illustrate operations for manufacturing a magnetic memory device according to some embodiments of the inventive concepts.
Figure 24:
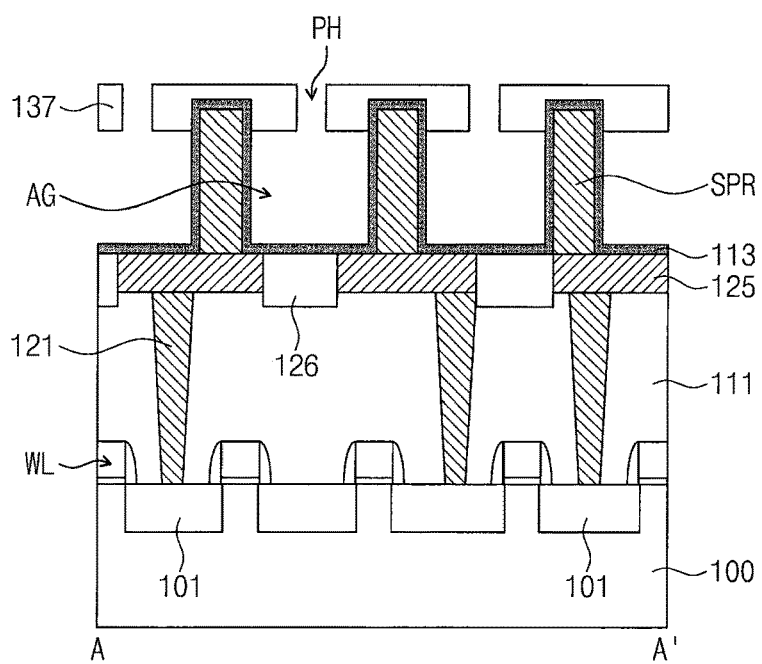
Figure 25:
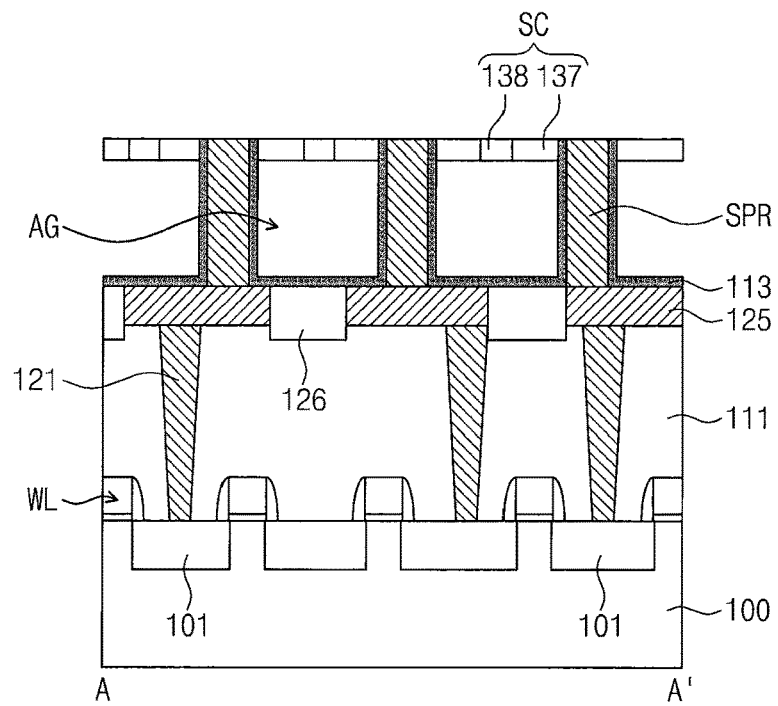

FIGS. 23 to 25 are cross-sectional views taken along a line A-A' of FIG. 4 to illustrate operations for manufacturing a magnetic memory device according to further embodiments of the inventive concepts. In the present embodiments, descriptions of the same components described in the aforementioned embodiments will not be repeated or will be mentioned briefly for the purpose of clarity and brevity in explanation.

Referring to FIG. 23, a sacrificial layer 131 and a first mold layer 137 may be sequentially formed on the structure described with reference to FIG. 6. The sacrificial layer 131 may be formed to have a top surface lower than the top surfaces of the conductive pillars SPR, and at least a portion of the first mold layer 137 may extend between the conductive pillars SPR. In some embodiments, the sacrificial layer 131 may include silicon organic hybrid (SOH). In some embodiments, the sacrificial layer 131 may include a material having an etch selectivity with respect to the first mold layer 137. In some embodiments, if the sacrificial layer 131 includes silicon oxide, the first mold layer 137 may include silicon nitride. In some embodiments, the sacrificial layer 131 may include poly-silicon, and the first mold layer 137 may include silicon oxide or silicon nitride. The sacrificial layer 131 may be formed by a CVD process.

Referring to FIG. 24, through-holes PH may be formed in the first mold layer 137. The through-holes PH may expose the sacrificial layer 131. A mask pattern may be formed on the first mold layer 137, and the first mold layer 137 may be then etched using the mask pattern as an etch mask to form the through-holes PH. The through-holes PH may be formed in an entire region between the conductive pillars SPR. In some embodiments, the through-holes PH may be locally formed in a region between the conductive pillars SPR.

The sacrificial layer 131 exposed by the through-holes PH may be removed to form an air gap AG. The sacrificial layer 131 may be removed using an ashing process and/or an ultraviolet irradiating process. If the sacrificial layer 131 has the etch selectivity with respect to the first mold layer 137, the sacrificial layer 131 may be removed by a selective etching process. The first mold layer 137 may not be removed and may remain after removal of the sacrificial layer 131.

Referring to FIG. 25, second mold patterns 138 may be formed to fill the through-holes PH. In some embodiments, the second mold patterns 138 may be formed of an insulating layer having poor step coverage. For example, the second mold patterns 138 may be formed using a plasma-enhanced CVD process or a PVD process. As a result, at least a portion of the air gap AG may be left unfilled. The formation process of the second mold patterns 138 may include a planarization process for exposing the top surfaces of the conductive pillars SPR. As a result, a mold structure SC including the first mold layer 137 and the second mold patterns 138 may be formed between the conductive pillars SPR. Thereafter, the same processes as described with reference to FIGS. 10 to 13 may be performed.

Figure 26:
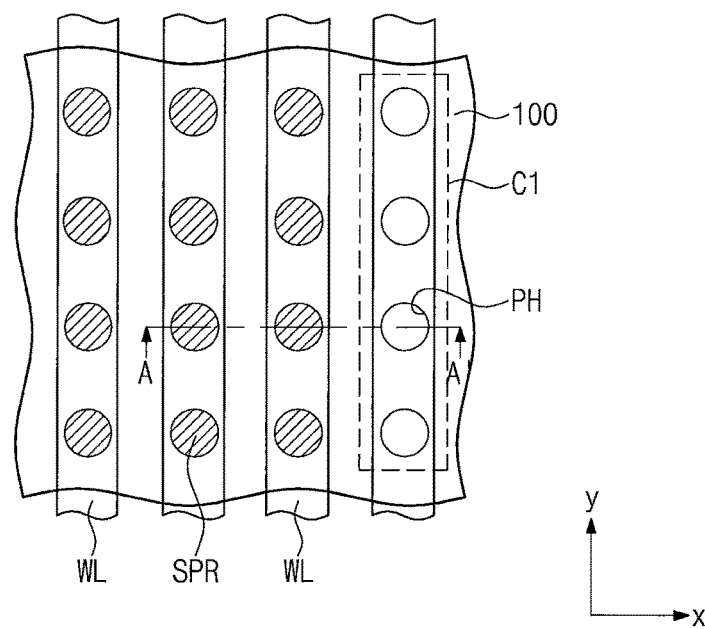
FIG. 26 is a plan view illustrating a magnetic memory device according to some embodiments of the inventive concepts.

FIG. 26 is a plan view illustrating a magnetic memory device according to yet still other embodiments of the inventive concepts. FIGS. 27 to 30 are cross-sectional views taken along a line A-A' of FIG. 26 illustrating operations for manufacturing a magnetic memory device according to some embodiments of the inventive concepts. In the present embodiments, descriptions of the same components described in the aforementioned embodiments will not be repeated or will be mentioned briefly for the purpose of clarity and brevity in explanation.

Figure 27:
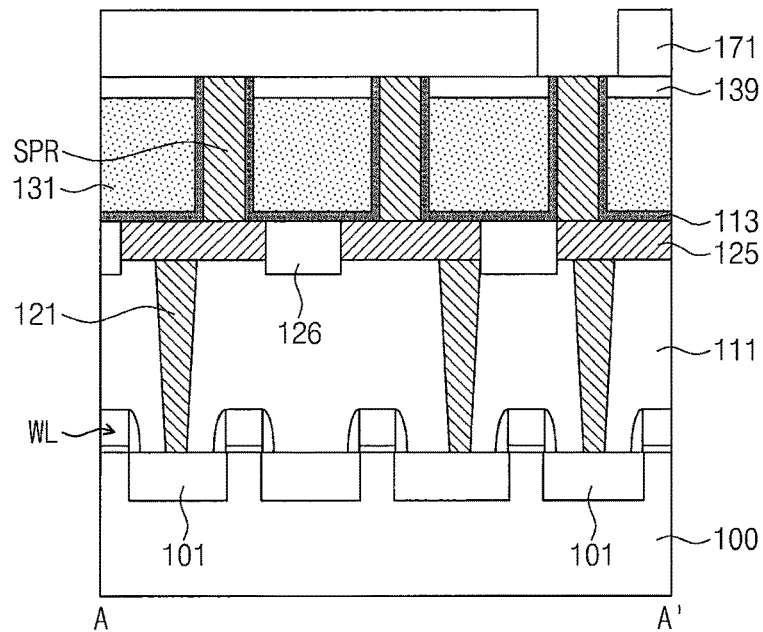
FIGS. 27 to 30 are cross-sectional views taken along a line A-A' of FIG. 26 that illustrate operations for manufacturing a magnetic memory device according to some embodiments of the inventive concepts.

Referring to FIGS. 26 and 27, a sacrificial layer 131 and a first mold pattern 139 may be sequentially formed on the structure described above with reference to FIG. 6. The sacrificial layer 131 may be formed to have a top surface lower than the top surfaces of the conductive pillars SPR, and the first mold pattern 139 disposed on the sacrificial layer 131 may be planarized to expose the top surfaces of the conductive pillars SPR. In some embodiments, the sacrificial layer 131 may include silicon organic hybrid (SOH). In some embodiments, the sacrificial layer 131 may include a material having an etch selectivity with respect to a mold structure described below.

The first mold pattern 139 may include a material having an etch selectivity with respect to the sacrificial layer 131. In some embodiments, if the sacrificial layer 131 includes silicon oxide, the first mold pattern 139 may include silicon nitride. In some embodiments, the sacrificial layer 131 may include poly-silicon, and the first mold pattern 139 may include silicon oxide or silicon nitride.

A mask pattern 171 may be formed on the first mold pattern 139. For example, the mask pattern 171 may include at least one of a photoresist, silicon nitride, and silicon oxynitride. The mask pattern 171 may expose at least one of the conductive pillars SPR. In some embodiments, the mask pattern 171 may expose the conductive pillars SPR constituting a first column C1 parallel to the y-direction in FIG. 26. In some embodiments, the conductive pillars SPR of the first column C1 may be outermost conductive pillars SPR in a cell region of a magnetic memory device.

Figure 28:
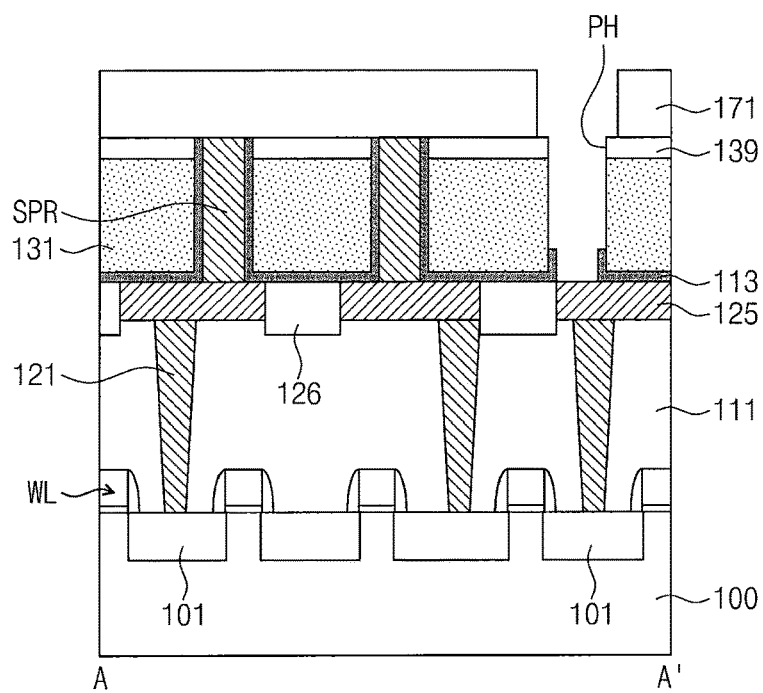

Referring to FIGS. 26 and 28, the conductive pillars SPR of the first column C1 exposed by the mask pattern 171 may be removed to form through-holes PH. Portions of the capping insulating layer 113 adjacent to the through-holes PH may also be removed when the conductive pillars SPR of the first column C1 are removed. In some embodiments, the portions of the capping insulating layer 113 adjacent to the through-holes PH may be removed by an additional etching process. The through-holes PH may expose sidewalls of the sacrificial layer 131.

Figure 29:
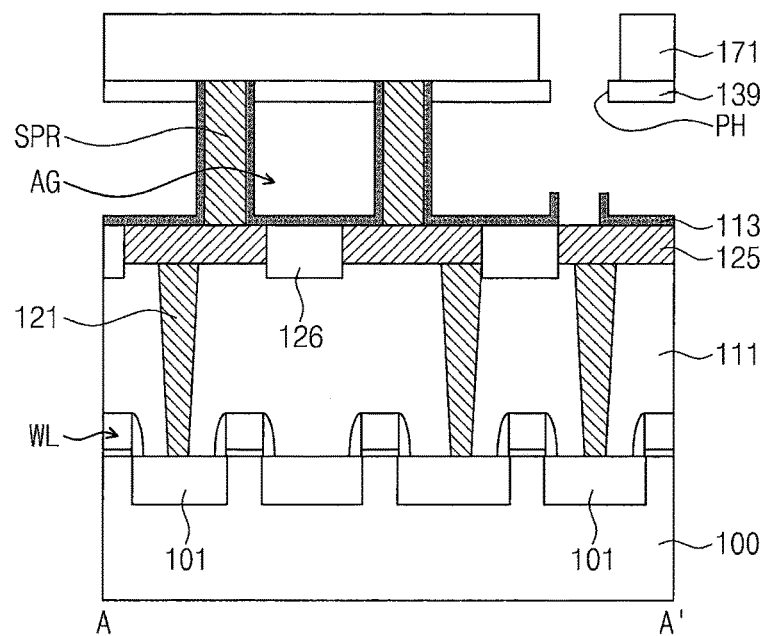

Referring to FIGS. 26 and 29, the sacrificial layer 131 exposed by the through-holes PH may be selectively removed to form an air gap AG. If the sacrificial layer 131 includes SOH, the sacrificial layer 131 may be removed using an ashing process and/or an ultraviolet irradiating process. In some embodiments, if the sacrificial layer 131 has the etch selectivity with respect to the first mold pattern 139, the sacrificial layer 131 may be removed using a selective etching process.

Figure 30:
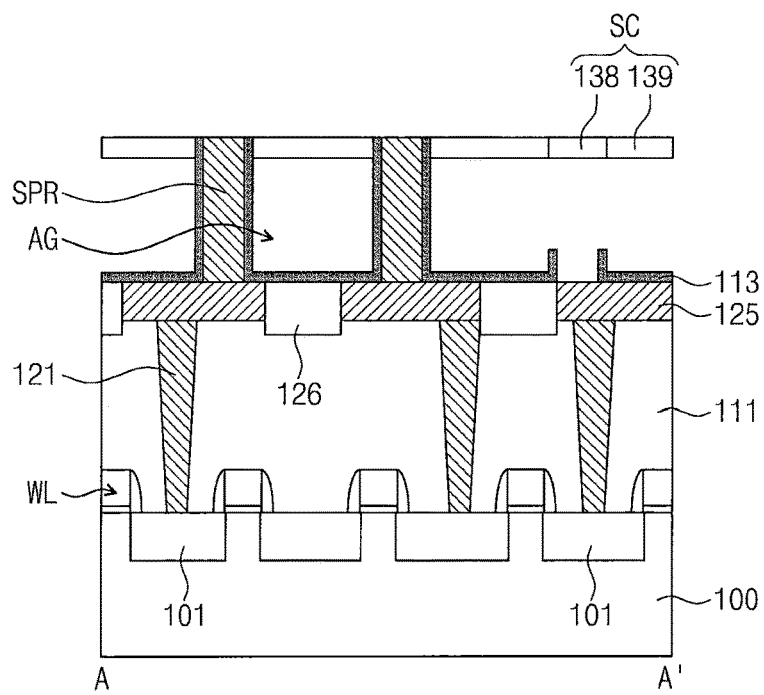

Referring to FIGS. 26 and 30, second mold patterns 138 may be formed to fill the through-holes PH, and thus, a mold structure SC including the first mold pattern 139 and the second mold patterns 138 may be formed. The second mold patterns 138 may be formed of an insulating layer having poor step coverage. For example, the second mold patterns 138 may be formed by a plasma-enhanced CVD process or a PVD process. As a result, at least a portion of the air gap AG may not be filled with the second mold patterns 138. The formation process of the second mold patterns 138 may include a planarization process. Thereafter, the same processes as described with reference to FIGS. 10 to 13 may be performed.

Figure 31:
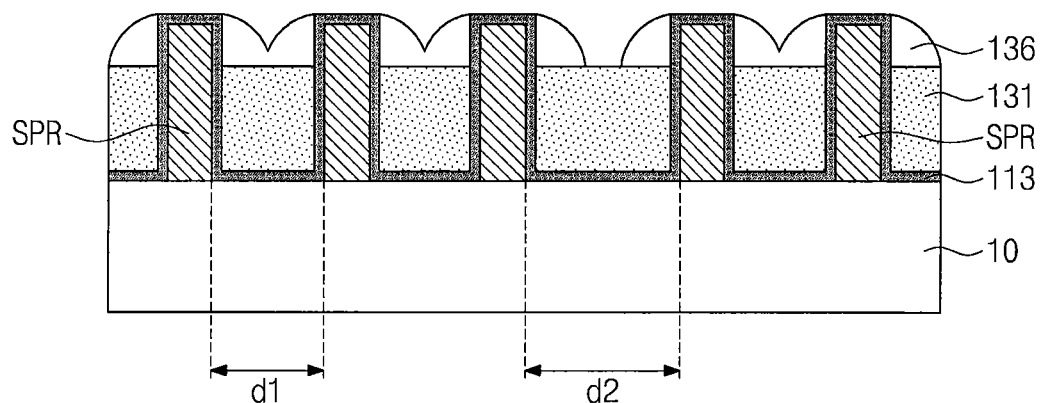
FIGS. 31 to 33 are cross-sectional views illustrating operations for manufacturing a magnetic memory device according to some embodiments of the inventive concepts.
Figure 32:
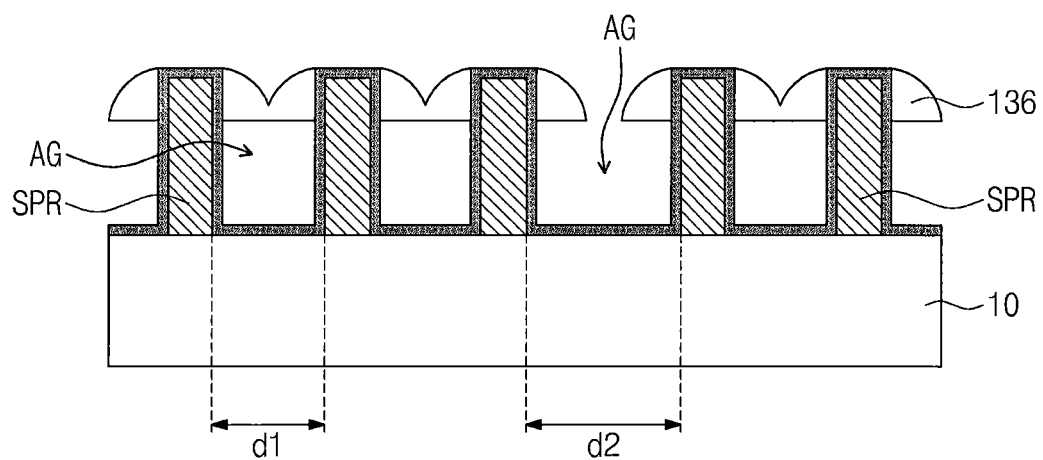
Figure 33:
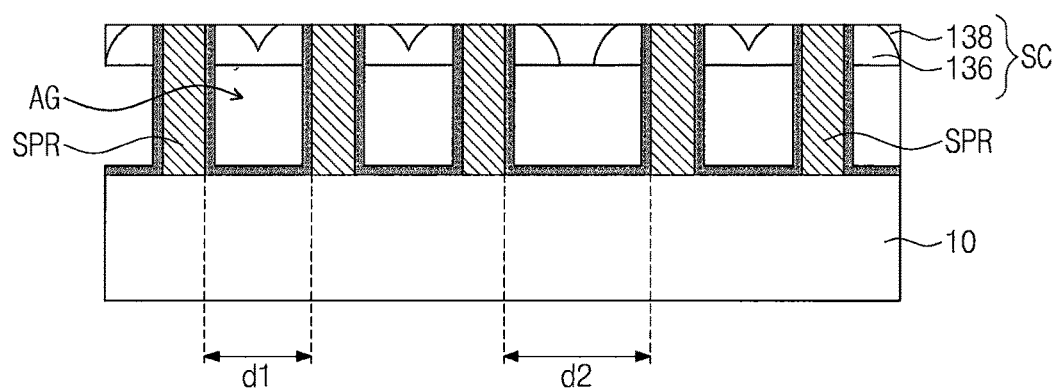

FIGS. 31 to 33 are cross-sectional views illustrating operations for manufacturing a magnetic memory device according to yet still other embodiments of the inventive concepts. In the present embodiments, descriptions of the same components described in the aforementioned embodiments will not be repeated or will be mentioned briefly for the purpose of clarity and brevity in explanation.

Referring to FIG. 31, conductive pillars SPR may be formed on a substrate 10. The substrate 10 may be a substrate including the selection elements and the contacts described with reference to FIG. 13. A capping insulating layer 113 may be formed on the conductive pillars SPR. For example, the capping insulating layer 113 may include silicon nitride or silicon oxynitride.

A sacrificial layer 131 may be formed between the conductive pillars SPR. The sacrificial layer 131 may have a top surface lower than top surfaces of the conductive pillars SPR. First mold patterns 136 may be formed on sidewalls of upper portions of the conductive pillars SPR. The first mold patterns 136 may be formed on the sidewalls of the upper portions of the conductive pillars SPR on which the capping insulating layer 113 is formed. For example, an insulating layer may be formed on the substrate 100 having the sacrificial layer 131, and a dry etching process may be performed on the insulating layer to form the first mold patterns 136 having sidewall spacer-like shapes.

Some of the first mold patterns 136 may be spaced apart from each other between the conductive pillars SPR adjacent to each other and the others of the first mold patterns 136 may be connected to each other. In other words, if a distance between adjacent conductive pillars SPR is a first distance d1, the first mold patterns 136 may be connected to each other between the conductive pillars SPR spaced apart from each other at the first distance d1. If a distance between adjacent conductive pillars SPR is a second distance d2 greater than the first distance d1, the first mold patterns 136 may be spaced apart from each other between the conductive pillars SPR spaced apart from each other at the second distance d2, thereby exposing the sacrificial layer 131.

Referring to FIG. 32, the sacrificial layer 131 may be removed to form an air gap AG. The sacrificial layer 131 may be removed through a space between the first mold patterns 136. In some embodiments, the sacrificial layer 131 may be removed using an ashing process and/or an ultraviolet irradiating process. In some embodiments, if the sacrificial layer 131 has an etch selectivity with respect to the first mold patterns 136, the sacrificial layer 131 may be removed using a selective etching process.

Referring to FIG. 33, second mold patterns 138 may be formed between the first mold patterns 136. In some embodiments, the second mold patterns 138 may be formed of an insulating layer having poor step coverage. For example, the second mold patterns 138 may be formed by a plasma-enhanced CVD process or a PVD process. As a result, at least a portion of the air gap AG may not be filled with the second mold patterns 138. The formation process of the second mold patterns 138 may include a planarization process for exposing the top surfaces of the conductive pillars SPR. As a result, a mold structure SC including the first and second mold patterns 136 and 138 may be formed between the conductive pillars SPR. Upper portions of the first mold patterns 136 and an upper portion of the capping insulating layer 113 may be removed by the planarization process. Thereafter, the same processes as described with reference to FIGS. 10 to 13 may be performed.

Figure 34:
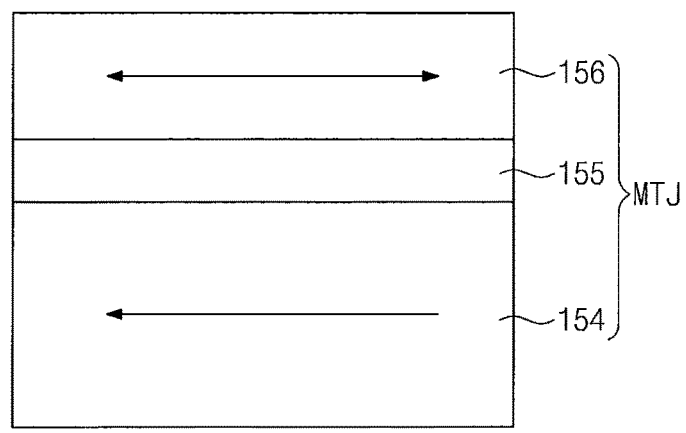
FIG. 34 is a conceptual diagram illustrating a magnetic tunnel junction structure according to some embodiments of the inventive concepts.

FIG. 34 is a conceptual diagram illustrating a magnetic tunnel junction structure according to some embodiments of the inventive concepts. A magnetic tunnel junction structure MTJ according to the present embodiments may include a first magnetic pattern 154, a tunnel insulating pattern 155, and a second magnetic pattern 156. One of the first and second magnetic patterns 154 and 156 may be a free layer of the magnetic tunnel junction structure MTJ, and the other of the first and second magnetic patterns 154 and 156 may be a fixed layer of the magnetic tunnel junction structure MTJ. Hereinafter, for the purpose of clarity and brevity in explanation, the first magnetic pattern 154 will be described as the fixed layer, and the second magnetic pattern 156 will be described as the free layer. However, the inventive concepts are not limited thereto. In some embodiments, the first magnetic pattern 154 may be the free layer, and the second magnetic pattern 156 may be the fixed layer. An electrical resistance of the magnetic tunnel junction structure MTJ may be dependent on magnetization directions of the free layer and the fixed layer. The magnetic tunnel junction structure MTJ may have a first electrical resistance when the magnetization directions of the free and fixed layers are parallel to each other. The magnetic tunnel junction structure MTJ may have a second electrical resistance greater than the first electrical resistance when the magnetization directions of the free and fixed layers are anti-parallel to each other. Thus, the electrical resistance of the magnetic tunnel junction structure MTJ may be controlled by changing the magnetization direction of the free layer. This property may be used for data storage purposes according to some embodiments of the inventive concepts.

In some embodiments, the first and second magnetic patterns 154 and 156 may have horizontal magnetization structures in which magnetization directions are parallel to a top surface of the tunnel insulating pattern 155. In the present embodiments, the first magnetic pattern 154 may include a layer including an anti-ferromagnetic material and a layer including a ferromagnetic material. The layer including the anti-ferromagnetic material may include at least one of PtMn, IrMn, MnO, MnS, MnTe, $MnF_2$, $FeCl_2$, FeO, $CoCl_2$, CoO, $NiCl_2$, NiO, or Cr. In some embodiments, the layer including the anti-ferromagnetic material may include one or more precious metals. The precious metals may include ruthenium (Ru), rhodium (Rh), palladium (Pd), osmium (Os), iridium (Ir), platinum (Pt), gold (Au), and silver (Ag). The layer including the ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The second magnetic pattern 156 may include a material having a changeable magnetization direction. The second magnetic pattern 156 may include a ferromagnetic material. For example, the second magnetic pattern 156 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The second magnetic pattern 156 may consist of a plurality of layers. For example, the second magnetic pattern 156 may include a plurality of layers including a ferromagnetic material and a layer including a non-magnetic material disposed between the layers including the ferromagnetic material. The layers including the ferromagnetic material and the layer including the non-magnetic material may constitute a synthetic anti-ferromagnetic layer. The synthetic anti-ferromagnetic layer may reduce a critical current density of the magnetic memory device and may improve thermal stability of the magnetic memory device.

The tunnel insulating pattern 155 may include at least one of magnesium oxide (MgO), titanium oxide (TiO), aluminum oxide (AlO), magnesium-zinc oxide (MgZnO), magnesium-boron oxide (MgBO), a nitride including titanium (Ti), and a nitride including vanadium (V). In some embodiments, the tunnel insulating pattern 155 may be a single-layer of magnesium oxide (MgO). In other embodiments, the tunnel insulating pattern 155 may include a plurality of layers. The tunnel insulating pattern 155 may be formed by a CVD process.

Figure 35:
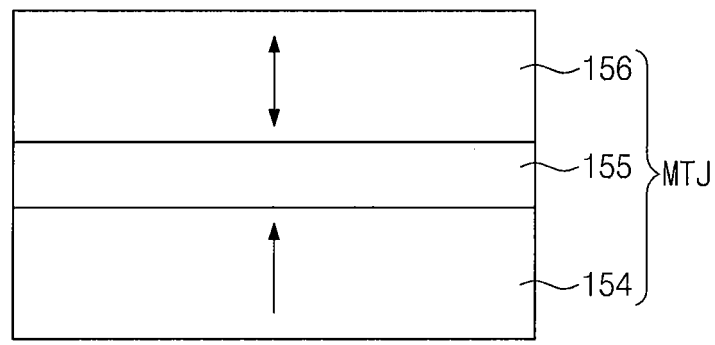
FIG. 35 is a conceptual diagram illustrating a magnetic tunnel junction structure according to some embodiments of the inventive concepts.

FIG. 35 is a conceptual diagram illustrating a magnetic tunnel junction structure according to some embodiments of the inventive concepts. In the present embodiments, the first magnetic pattern 154 and the second magnetic patterns 156 may have perpendicular magnetization structures in which magnetization directions are substantially perpendicular to the top surface of the tunnel insulating pattern 155. In the present embodiments, the first magnetic pattern 154 and the second magnetic patterns 156 may include at least one of a material having a $L1_0$ crystal structure, a material having a hexagonal close packed (HCP) lattice structure, and an amorphous rare-earth transition metal (RE-TM) alloy. For example, the first magnetic pattern 154 and the second magnetic patterns 156 may include at least one material having the $L1_0$ crystal structure, which may include $Fe_{50}Pt_{50}$, $Fe_{50}Pd_{50}$, $Co_{50}Pt_{50}$, $Co_{50}Pd_{50}$, and $Fe_{50}Ni_{50}$. The first magnetic pattern 154 and the second magnetic patterns 156 may include one of a cobalt-platinum (Co3Pt) ordered alloy and a cobalt-platinum disordered alloy that have the HCP lattice structure and platinum of about 10 at % to about 45 at %. In still further embodiments, the first magnetic pattern 154 and the second magnetic patterns 156 may include at least one of amorphous RE-TM alloys which includes at least one of iron (Fe), cobalt (Co) and nickel (Ni) and at least one of terbium (Tb), dysprosium (Dy) and gadolinium (Gd) corresponding to rare-earth transition metals.

The first magnetic pattern 154 and the second magnetic patterns 156 may include a material having interface perpendicular magnetic anisotropy. The interface perpendicular magnetic anisotropy means that a magnetic layer having an intrinsic horizontal magnetization property has a perpendicular magnetization direction by an influence of an interface with another layer adjacent to the magnetic layer. The intrinsic horizontal magnetic property means that a magnetic layer has a magnetization direction parallel to its widest surface without an external cause. For example, if a magnetic layer having the intrinsic horizontal magnetic property is formed on a substrate and an external magnetic force is not present, a magnetization direction of the magnetic layer may be substantially parallel to a top surface of the substrate.

The first magnetic pattern 154 and the second magnetic patterns 156 may include, for example, at least one of cobalt (Co), iron (Fe), and nickel (Ni). The first magnetic pattern 154 and the second magnetic patterns 156 may further include at least one non-magnetic material, including boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). In some embodiments, the first magnetic pattern 154 and the second magnetic patterns 156 may include CoFe or NiFe and may further include boron (B). The first magnetic pattern 154 and the second magnetic patterns 156 may further include at least one of titanium (Ti), aluminum (Al), magnesium (Mg), tantalum (Ta), or silicon (Si), so saturation magnetization amounts of the first magnetic pattern 154 and the second magnetic patterns 156 may be reduced. The first magnetic pattern 154 and the second magnetic patterns 156 may be formed using a sputtering process or a plasma-enhanced CVD process.

The magnetic memory devices of the embodiments described above may be encapsulated using various packaging techniques. For example, the magnetic memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the magnetic memory device according to one of the above embodiments is mounted may further include at least one semiconductor device (e.g., a controller and/or a logic device) that controls the semiconductor memory device.

Figure 36:
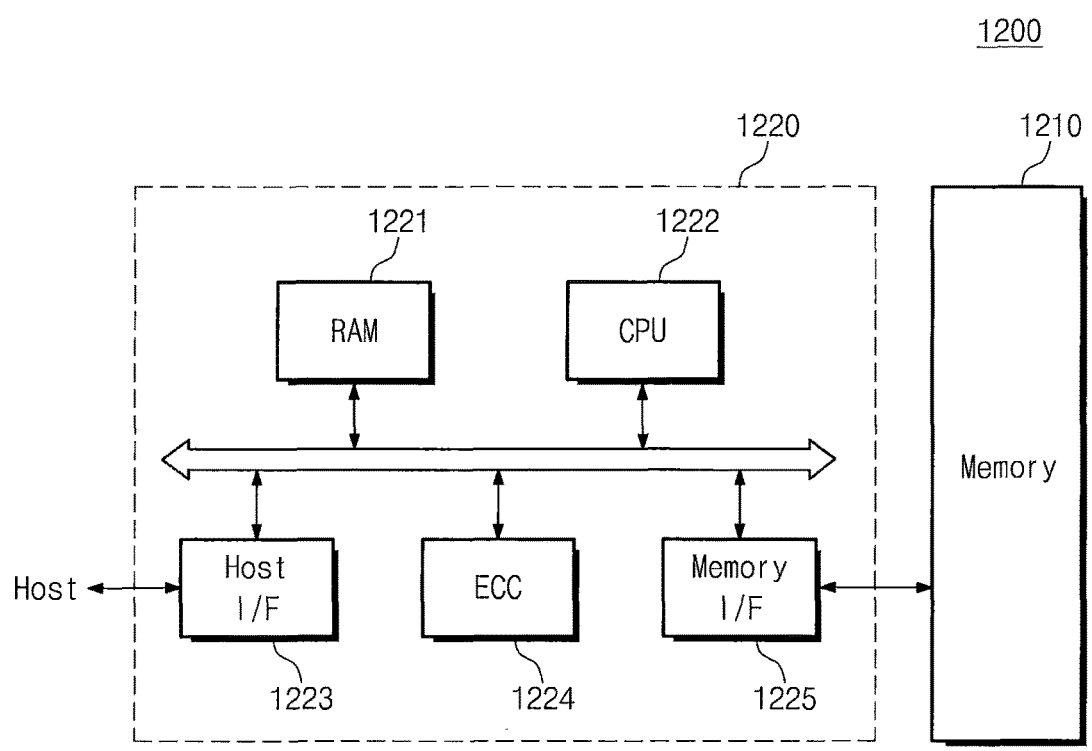
FIG. 36 is a schematic block diagram illustrating memory cards including magnetic memory devices according to some embodiments of the inventive concepts.

FIG. 36 is a schematic block diagram illustrating an embodiment of memory cards including magnetic memory devices according to embodiments of the inventive concepts.

Referring to FIG. 36, a memory card 1200 according to an embodiment of the inventive concept may include a memory device 1210. The memory device 1210 may include at least one of the magnetic memory devices according to the embodiments mentioned above. In other embodiments, the memory device 1210 may further include another type of a semiconductor memory device which is different from the magnetic memory devices according to the embodiments described above. For example, the memory device 1210 may further include a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include a RAM device 1221 used as a working memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

Figure 37:
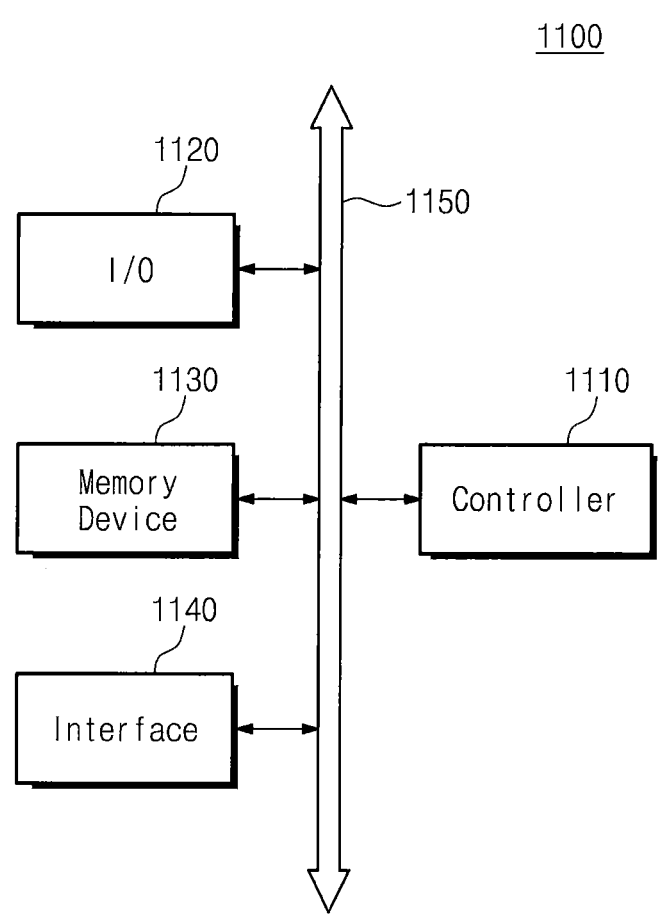
FIG. 37 is a schematic block diagram illustrating electronic systems including magnetic memory devices according to some embodiments of the inventive concepts.

FIG. 37 is a schematic block diagram illustrating an embodiment of electronic systems including magnetic memory devices according to embodiments of the inventive concepts.

Referring to FIG. 37, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device having a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the magnetic memory devices according to the embodiments described above. The memory device 1130 may further include another type of a semiconductor memory device which is different from the magnetic memory devices described above. For example, the memory device 1130 may further include a dynamic random access memory (DRAM) device and/or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products receiving or transmitting information data by wireless.

According to some embodiments of the inventive concepts, the air gap is formed in advance before the conductive layer is patterned, so that undesirable re-deposition of the etch by-products may be reduced. As a result, it is possible to prevent the short phenomenon caused by the re-deposition of the by-products.

While embodiments of the inventive concepts have been described, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A magnetic memory device comprising:
    a substrate;
    contacts disposed on the substrate;
    conductive pillars disposed on the contacts;
    magnetic tunnel junction structures disposed on the conductive pillars;
    residual mold patterns provided under the magnetic tunnel junction structures, the residual mold patterns surrounding upper portions of the conductive pillars; and
    conductive etch residue layers on lower sidewalls of the conductive pillars below the residual mold patterns.

2. The magnetic memory device of claim 1, wherein the residual mold patterns are ring shaped.

3. The magnetic memory device of claim 1, wherein sidewalls of the residual mold patterns are substantially coplanar with sidewalls of the magnetic tunnel junction structures disposed on the residual mold patterns.

4. The magnetic memory device of claim 1, wherein bottom surfaces of the residual mold patterns are higher than bottom surfaces of the conductive pillars.

5. The magnetic memory device of claim 1, further comprising a protection insulating layer extending along sidewalls of the conductive pillars, sidewalls of the magnetic tunnel junction structures, and sidewalls of the residual mold patterns, and wherein the residual mold patterns include a material different from that of the protection insulating layer.

6. The magnetic memory device of claim 5, further comprising a capping insulating layer provided along a sidewall and a bottom surface of a gap region between the conductive pillars.

7. The magnetic memory device of claim 6, wherein the capping insulating layer is in contact with bottom surfaces of the magnetic tunnel junction structures.

8. The magnetic memory device of claim 6, wherein the conductive etch residue layers are disposed between the capping insulating layer and the protection insulating layer.

9. The magnetic memory device of claim 1, further comprising conductive pads disposed between the contacts and the conductive pillars.

10. The magnetic memory device of claim 1, further comprising a protection insulating layer extending along a sidewall of at least one of the magnetic tunnel junction structures, a sidewall of at least one of the residual mold patterns and a sidewall of at least one of the conductive etch residue layers, wherein the residual mold patterns include a material different from that of the protection insulating layer.

11. The magnetic memory device of claim 10, further comprising a capping insulating layer extending between at least one of the residual mold patterns and at least one the conductive pillars and between at least one of the conductive etch residue layers and the at least one of the conductive pillars.

12. A magnetic memory device comprising:
    a substrate;
    a contact disposed on the substrate;
    a conductive pillar disposed on the contact;
    a magnetic tunnel junction structure disposed on the conductive pillar;
    a residual mold patterns under the magnetic tunnel junction structure and on an upper portion of a sidewall of the conductive pillar; and
    a conductive etch residue layer on a lower portion of the sidewall of the conductive pillar below the residual mold pattern.

13. The magnetic memory device of claim 12, further comprising a protection insulating layer extending along a sidewall of the conductive pillar, a sidewall of the magnetic tunnel junction structure, and a sidewall of the residual mold patterns, and wherein the residual mold pattern includes a material different from that of the protection insulating layer.

14. The magnetic memory device of claim 12, further comprising a capping insulating layer extending between the sidewall of the conductive pillar and the residual mold pattern and between the sidewall of conductive pillar and the conductive etch residue layer.

15. The magnetic memory device of claim 14, wherein the capping insulating layer is in contact with a bottom surface of the magnetic tunnel junction structure.

* * * * *